US009736353B2

United States Patent
Jo

(10) Patent No.: US 9,736,353 B2
(45) Date of Patent: Aug. 15, 2017

(54) IMAGE SENSOR INCLUDING PHASE DIFFERENCE DETECTING PIXEL

(71) Applicant: SK hynix Inc., Gyeonggi-do (KR)

(72) Inventor: Wan-Hee Jo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/858,984

(22) Filed: Sep. 18, 2015

(65) Prior Publication Data

US 2017/0070663 A1    Mar. 9, 2017

(30) Foreign Application Priority Data

Sep. 7, 2015  (KR) .................. 10-2015-0126171

(51) Int. Cl.
H04N 5/232    (2006.01)
H04N 5/369    (2011.01)
H04N 9/04     (2006.01)
G06T 3/40     (2006.01)
H01L 27/146   (2006.01)

(52) U.S. Cl.
CPC ....... *H04N 5/23212* (2013.01); *G06T 3/4015* (2013.01); *H01L 27/14621* (2013.01); *H01L 27/14623* (2013.01); *H01L 27/14627* (2013.01); *H04N 5/3696* (2013.01); *H04N 9/045* (2013.01); *H04N 2209/046* (2013.01)

(58) Field of Classification Search
None
See application file for complete search history.

(56) References Cited

U.S. PATENT DOCUMENTS

| | | | | |
|---|---|---|---|---|
| 2012/0193515 | A1* | 8/2012 | Agranov | G01S 3/782 250/208.1 |
| 2013/0088621 | A1* | 4/2013 | Hamada | H04N 5/3696 348/281 |
| 2014/0347516 | A1* | 11/2014 | Sano | H04N 5/355 348/230.1 |

* cited by examiner

*Primary Examiner* — Stephen Coleman
(74) *Attorney, Agent, or Firm* — IP & T Group LLP

(57) ABSTRACT

Provided is an image sensor including a pixel array including a plurality of unit pixel arrays. Each of the plurality of unit pixel arrays may include a plurality of unit pixel blocks arranged in a 4×4 matrix, each of the plurality of unit pixel blocks may include a phase difference detecting unit so that each of the plurality of unit pixel arrays may include phase difference detecting units, the phase difference detecting unit may include a first phase difference detecting pixel and a second phase difference detecting pixel, the first and the second phase difference detecting pixels may have first and second openings, respectively, the first and the second openings may be arranged in an eccentrically manner with respect to each other, and the phase difference detecting units arranged at each of the plurality of unit pixel blocks may be asymmetrical to each other on the basis of a boundary line between adjacent unit pixel blocks.

21 Claims, 26 Drawing Sheets

IMAGE SENSOR INCLUDING PHASE DIFFERENCE DETECTING PIXEL

CROSS-REFERENCE TO RELATED APPLICATIONS

The present application claims priority of Korean Patent Application Nos. 10-2015-0126171, filed on Sep. 7, 2015, which is herein incorporated by reference in its entirety.

BACKGROUND

Exemplary embodiments of the present invention relate to a semiconductor device manufacturing technology, and more particularly, to an image sensor including a phase difference detecting pixel.

An image sensor converts an optical image into an electrical signal. Recently, due to the development of the computer industry and the communication industry, a demand for an image sensor with improved performance has increased for various devices, such as digital cameras, camcorders, Personal Communication System (PCS), game machines, security cameras, medical micro-cameras, and robots.

SUMMARY

Various embodiments are directed to an image sensor including a phase difference detecting pixel having improved performance.

In an embodiment, an image sensor may include a pixel array including a plurality of unit pixel arrays. Each of the plurality of unit pixel arrays may include a plurality of unit pixel blocks arranged in a 4×4 matrix, wherein each of the plurality of unit pixel blocks may include a phase difference detecting unit so that each of the plurality of unit pixel arrays may include phase difference detecting units, wherein the phase difference detecting unit may include a first phase difference detecting pixel and a second phase difference detecting pixel, wherein the first and the second phase difference detecting pixels may have first and second openings, respectively, wherein the first and the second openings may be arranged in an eccentrically manner with respect to each other, and Wherein the phase difference detecting units arranged at each of the plurality of unit pixel blocks may be asymmetrical to each other on the basis of a boundary line between adjacent unit pixel blocks.

When each of the plurality of unit pixel blocks faces each other on the basis of a boundary line between adjacent unit pixel blocks, the phase difference detecting units arranged in the unit pixel blocks facing each other may be arranged so as not to overlap with each other.

The phase difference detecting units included in a given unit pixel array may be located at different columns from each other. The first phase difference detecting pixel and the second phase difference detecting pixel may be located at different rows and at the same column. A spacing between adjacent phase difference detecting units included in the given unit pixel array may be constant in a row direction and in a column direction, respectively, and wherein the adjacent phase difference detecting units have a first spacing in the row direction and a second spacing smaller than the first spacing in the column direction. The plurality of unit pixel blocks may be arranged in a matrix having row lines and column lines, and in each of the unit pixel arrays, arrangements of the phase difference detecting units arranged in the plurality of unit pixel blocks at the same row line may be the same as each other, arrangements of the phase difference detecting units arranged in the plurality of unit pixel blocks at odd-numbered row lines may be the same as each other, arrangements of the phase difference detecting units arranged in the plurality of unit pixel blocks at even-numbered row lines may be the same as each other, and the arrangements of the phase difference detecting units arranged in the plurality of unit pixel blocks at the even-numbered row lines may be opposite to the arrangements of the phase difference detecting units arranged in the plurality of unit pixel blocks at the odd-numbered row lines.

The phase difference detecting units included in a given unit pixel array may be located at different rows from each other. The first phase difference detecting pixel and the second phase difference detecting pixel may be located at different columns and at the same row. A spacing between adjacent phase difference detecting units included in each of the unit pixel arrays may be constant in a row direction and in a column direction, and wherein the adjacent phase difference detecting units have a first spacing in the row direction and a second spacing larger than the first spacing in the column direction. The plurality of unit pixel blocks may be arranged in a matrix having row lines and column lines, and in each of the unit pixel arrays, arrangements of the phase difference detecting units arranged in the plurality of unit pixel blocks at the same column line may be the same as each other, arrangements of the phase difference detecting units arranged in the plurality of unit pixel blocks at odd-numbered column lines may be the same as each other, arrangements of the phase difference detecting units arranged in the plurality of unit pixel blocks at even-numbered column lines may be the same as each other, and the arrangements of the phase difference detecting units arranged in the plurality of unit pixel blocks at the even-numbered column lines may be opposite to the arrangements of the phase difference detecting units arranged in the plurality of unit pixel blocks at the odd-numbered column lines.

The first phase difference detecting pixel and the second phase difference detecting pixel may have first and second openings, respectively, wherein the first and the second openings may be eccentrically disposed one side and the other side in a row direction. The first phase difference detecting pixel and the second phase difference detecting pixel may have first and second openings, respectively, wherein the first and the second openings may be eccentrically disposed in one side and the other side in a column direction. The pixel array may include an RGr/GbB Bayer pattern in which red pixels, green pixels and blue pixels are repeatedly arranged, or a WRGB pattern in which white pixels, red pixels, green pixels and blue pixels are repeatedly arranged. Both of the first phase difference detecting pixel and the second phase difference detecting pixel may replace blue pixels.

In an embodiment, an image sensor may include a pixel array in which a plurality of unit pixel groups each having a 2×2 matrix are two-dimensionally arranged, wherein the pixel array may include a plurality of single channel pixel arrays in which a plurality of single channel pixel blocks may be arranged in a 4×4 matrix, respectively, and wherein the plurality of single channel pixel blocks may be formed by pixels extracted in the same position from each of the plurality of unit pixel groups and include a phase difference detecting unit, respectively; and wherein the phase difference detecting unit may include a first phase difference detecting pixel and a second phase difference detecting pixel which have openings eccentrically disposed in different directions; wherein in each of the plurality of single channel pixel arrays, the phase difference detecting units arranged in the plurality of single channel pixel blocks may not overlap with each other in a row direction or a column direction.

When in each of the plurality of single channel pixel arrays, the phase difference detecting units arranged in the plurality of single channel pixel blocks do not overlap with each other in a column direction, and wherein the first phase difference detecting pixel and the second phase difference detecting pixel may be located at different rows and at the same column. A spacing between adjacent phase difference detecting units in each of the plurality of single channel pixel arrays may be constant in a row direction and in a column direction, and wherein the adjacent phase difference detecting units have a first spacing in the row direction and a second spacing smaller than the first spacing in the column direction. The plurality of single channel pixel blocks may be arranged in a matrix having row lines and column lines, and in each of the single channel pixel arrays, arrangements of the phase difference detecting units arranged in the plurality of single channel pixel blocks at the same row line may be the same as each other, arrangements of the phase difference detecting units arranged in the plurality of single channel pixel blocks at odd-numbered row lines may be the same as each other, arrangements of the phase difference detecting units arranged in the plurality of single channel pixel blocks at even-numbered row lines may be the same as each other, and the arrangements of the phase difference detecting units arranged in the plurality of single channel pixel blocks at the even-numbered row lines may be opposite to the arrangements of the phase difference detecting units arranged in the plurality of single channel pixel blocks at the odd-numbered row lines.

When in each of the plurality of single channel pixel arrays, the phase difference detecting units arranged in the plurality of single channel pixel blocks do not overlap with each other in a row direction, and wherein the first phase difference detecting pixel and the second phase difference detecting pixel may be located at different columns and at the same row. A spacing between adjacent phase difference detecting units in each of the plurality of single channel pixel arrays is constant in a row direction and in a column direction, and wherein the adjacent phase difference detecting units have a first spacing in the row direction and a second spacing larger than the first spacing in the column direction. The plurality of single channel pixel blocks may be arranged in a matrix having row lines and column lines, and in each of the single channel pixel arrays, arrangements of the phase difference detecting units arranged in the plurality of single channel pixel blocks at the same column line may be the same as each other, arrangements of the phase difference detecting units arranged in the plurality of single channel pixel blocks at odd-numbered column lines may be the same as each other, arrangements of the phase difference detecting units arranged in the plurality of single channel pixel blocks at even-numbered column lines may be the same as each other, and the arrangements of the phase difference detecting units arranged in the plurality of single channel pixel blocks at the even-numbered column lines may be opposite to the arrangements of the phase difference detecting units arranged in the plurality of single channel pixel blocks at the odd-numbered column lines.

The pixel array may include a plurality of unit pixel arrays, wherein, in each of the plurality of unit pixel arrays, a plurality of unit pixel blocks may be arranged in a 4×4 matrix, and wherein each of the plurality of single channel pixel blocks may correspond to each of the plurality of unit pixel blocks. The pixel array may include a plurality of unit pixel arrays, wherein, in each of the plurality of unit pixel arrays, a plurality of unit pixel blocks may be arranged in a 4×4 matrix, wherein each of the plurality of unit pixel arrays may include a plurality of sub-sampling pixel arrays, wherein, in each of the plurality of sub-sampling pixel arrays, the sub-sampling pixel blocks may be arranged in a 4×4 matrix, and wherein each of the plurality of single channel pixel blocks may correspond to each of the plurality of sub-sampling pixel blocks. The first phase difference detecting pixel and the second phase difference detecting pixel may have first and second openings, respectively, wherein the first and the second openings may be eccentrically disposed in one side and the other side in a row direction. The first phase difference detecting pixel and the second phase difference detecting pixel may have first and second openings, respectively, wherein the first and the second openings may be eccentrically disposed in one side and the other side in a column direction. Each of the plurality of unit pixel groups may have an RGr/GbB Bayer pattern in which red pixels, green pixels and blue pixels are repeatedly arranged, or a WRGB pattern in which white pixels, red pixels, green pixels and blue pixels are repeatedly arranged. Each of the plurality of single channel pixel blocks may include a plurality of the blue pixels, and wherein the first phase difference detecting pixel and the second phase difference detecting pixel may replace the blue pixels.

DETAILED DESCRIPTION

Figure 1:
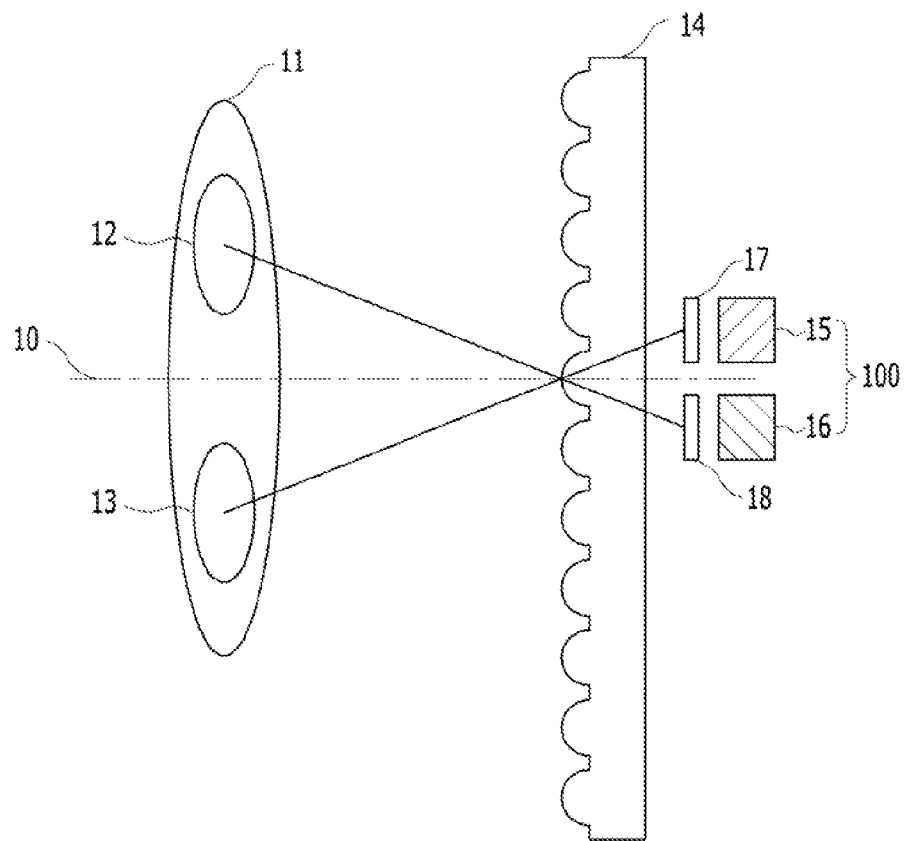
FIG. 1 is a diagram illustrating principles of detecting a phase difference by using phase difference detecting pixels.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated to clearly illustrate features of the embodiments. When a first layer is referred to as being "on" a second layer or "on" a substrate, it not only refers to a case in which the first layer is formed directly on the second layer or the substrate but also a case in which a third layer exists between the first layer and the second layer or the substrate.

The embodiments of the present invention may provide a method for improving performance of an image sensor including a phase difference detecting pixel. For that purpose, the embodiments of the present invention may provide an arrangement method and an arrangement of the phase difference detecting pixel in a pixel array. Here, the improved performance of the image sensor including the phase difference detecting pixel may mean rapid and uniform detection in a full frame and image interpolation characteristics into the phase difference detecting pixel, for example, an improved image quality.

In detecting a phase difference by using a pixel of an image sensor, the image sensor may have a structure where two pixels form a pair and shade different regions from each other by using a specific material layer on a photoelectric conversion element in order to selectively introduce incident light with respect to a specific direction. When the focus points are inconsistent with each other, a phase difference may occur in the pair of pixel units fabricated as above and thus, an operation such as auto-focusing (AF) and measurement of a focal length may be implemented in the image sensor by using the phase difference. Hereinafter, a phase difference detecting pixel in accordance with an embodiment of the present invention will be described with reference to the accompanying drawings.

Figure 2A:
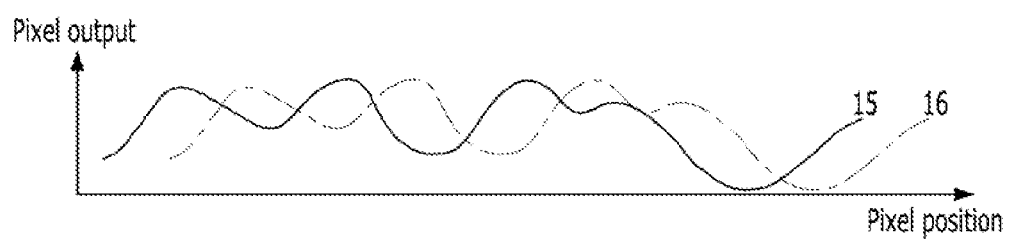
FIGS. 2A and 2B are diagrams illustrating the phase difference in accordance with FIG. 1.
Figure 2B:
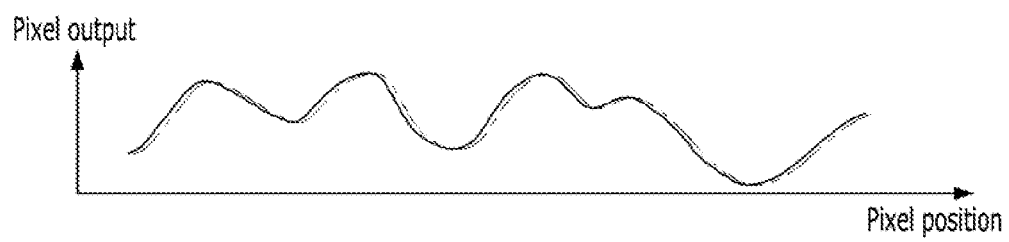

FIG. 1 is a diagram illustrating principles of detecting a phase difference by using phase difference detecting pixels. And, FIGS. 2A and 2B are diagrams illustrating the phase difference in accordance with FIG. 1.

As shown in FIG. 1, a phase difference detecting units 100 including a first phase difference detecting pixel 15 and a second phase difference detecting pixel 16 may be required to detect a phase difference by using phase difference detecting pixels. The first phase difference detecting pixel 15 and the second phase difference detecting pixel 16 may have openings eccentrically disposed in different directions from each other. Incident light entering through an imaging lens 11 may pass through a micro lens array 14 and be guided into the first phase difference detecting pixel 15 and the second phase difference detecting pixel 16 that include a photoelectric conversion layer 22 (shown in FIG. 3).

A part of the first phase difference detecting pixel 15 and a part of the second phase difference detecting pixel 16 may include openings for restricting a pupil 12 and a pupil 13 from the imaging lens 11. The openings are defined by a first shading mask 17 and a second shading mask 18 that restrict the pupils 12 and 13 from the imaging lens 11.

Among the pupils 12 and 13 of the imaging lens 11, the incident light from the pupil 12 that is disposed over an optical axis 10 of the imaging lens 11 may be guided into the second phase difference detecting pixel 16, whereas the incident light from the pupil 13 that is disposed under the optical axis 10 of the imaging lens 11 may be guided into the first phase difference detecting pixel 15. The first phase difference detecting pixel 15 and the second phase difference detecting pixel 16 may receive incident light, through the openings which are defined by the first and second shading masks 17 and 18, that is reversely projected by the micro lens array 14 from the pupils 12 and 13. This may be called "pupil division."

Continuous outputs of the first phase difference detecting pixel 15 and the second phase difference detecting pixel 16, which incorporate pupil division, are shown in FIGS. 2A and 2B. In the graphs of FIGS. 2A and 2B, the horizontal axes denote the positions of the first phase difference detecting pixel 15 and the second phase difference detecting pixel 16, while the vertical axes denote output values of the first phase difference detecting pixel 15 and the second phase difference detecting pixel 16.

Comparing the outputs of the first phase difference detecting pixel 15 and the second phase difference detecting pixel 16, it may be seen that the outputs are the same but shifted, generating the phase difference. This may be due to the difference in the image formation positions of light coming from the eccentrically disposed pupils 12 and 13 of the imaging lens 11. As illustrated in FIG. 2A, when focus points of light coming from the eccentrically disposed pupils 12 and 13 are inconsistent with each other, the first phase difference detecting pixel 15 and the second phase difference detecting pixel 16 may exhibit an output phase difference.

As illustrated in FIG. 2B, when the focus points of light coming from the eccentrically disposed pupils 12 and 13 are consistent with each other, images may be formed at the same position. Additionally, the direction of focus may be determined from the focus difference. A "front-focusing" indicates that an object is in a front focus state. In front-focusing, the phase of the output of the first phase difference detecting pixel 15 may be shifted to the left than that in the focused phase, and the phase of the output of the second phase difference detecting pixel 16 may be shifted to the right than that in the focused phase.

In contrast, "back-focusing" indicates that an object is in a back focus state. When a back-focusing occurs, the phase of the output of the first phase difference detecting pixel 15 may be shifted to the right than that in the focused phase, and the phase of the output of the second phase difference detecting pixel 16 may be shifted to the left than in the focused phase.

FIG. 2A shows front-focusing and the case contrary to FIG. 2A shows back-focusing. The shift amount between the phases of the first phase difference detecting pixel 15 and the second phase difference detecting pixel 16 may be converted to a deviation amount between the points of focus.

Figure 3:
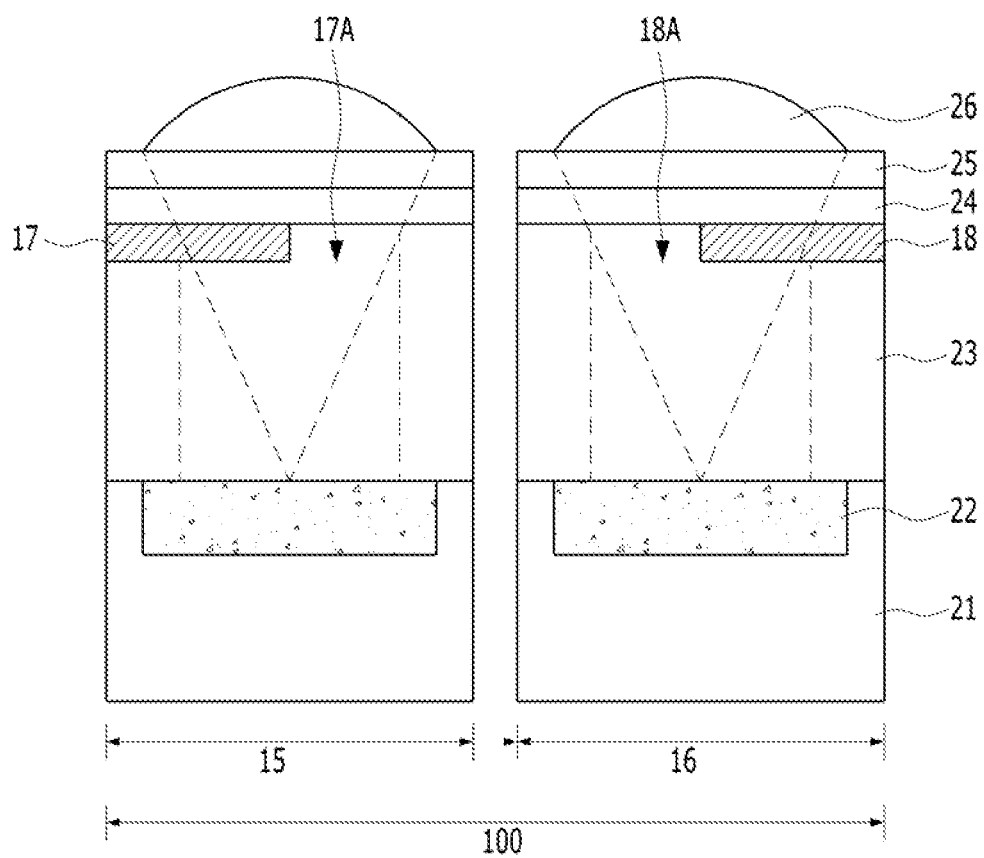
FIG. 3 is a cross-sectional view schematically illustrating a phase difference detecting unit of FIG. 1.
Figure 4A:
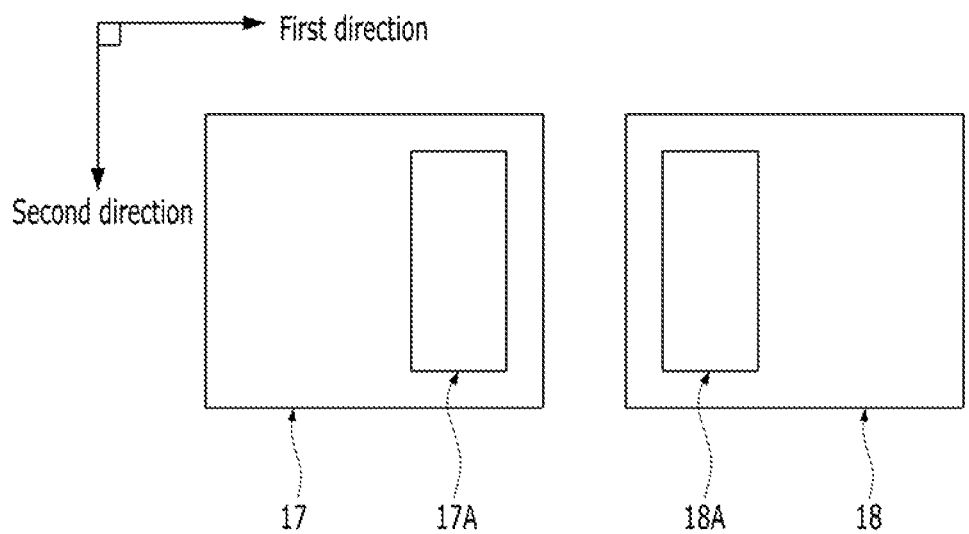
FIGS. 4A and 4B are plan views illustrating a shading mask in the phase difference detecting unit shown in FIG. 3.
Figure 4B:
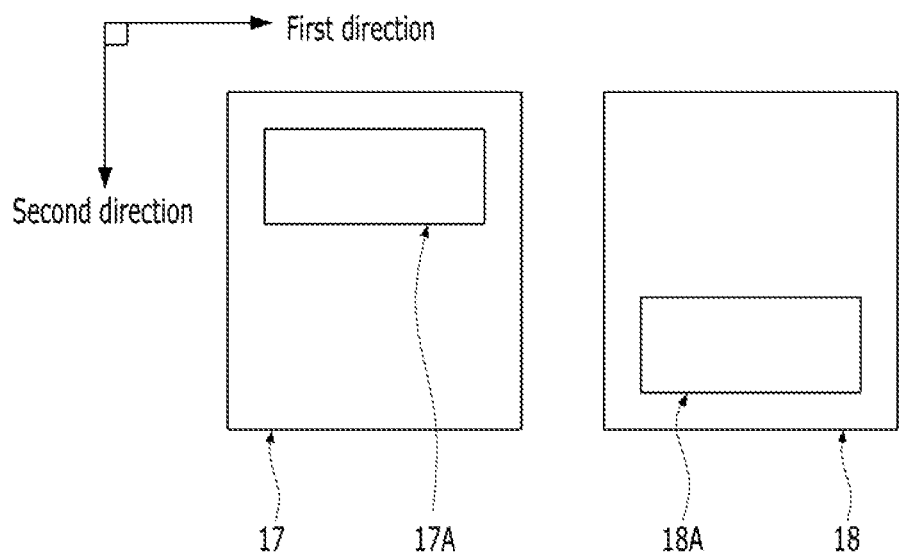

FIG. 3 is a cross-sectional view schematically illustrating a phase difference detecting unit of FIG. 1. And, FIGS. 4A and 4B are plan views illustrating a shading mask in the phase difference detecting unit shown in FIG. 3.

Referring to FIGS. 1 to 3, the phase difference detecting units 100 may include a pair of phase detecting pixels, that is, the first phase difference detecting pixel 15 and the second phase difference detecting pixel 16. Each of first phase difference detecting pixel 15 and second phase difference detecting pixel 16 may include a micro lens 26, a planarization layer 25, a color filter layer 24, an intermediate layer 23, a photoelectric conversion layer 22, and a substrate 21.

Moreover, the first phase difference detecting pixel 15 may include a first shading mask 17 having a first opening 17A, and the second phase difference detecting pixel 16 may include a second shading mask 18 having a second opening 18A. The intermediate layer 23 may include a line layer (not shown), and the photoelectric conversion layer 22 may include a photodiode.

The shading masks 17 and 18 may define the first and second openings 17A and 18A that restrict the pupils 12 and 13 from the imaging lens 11. The first and second shading masks 17 and 18 may be line layers (not shown) or include a material for forming the line layers (not shown), for example, a metallic material. In addition, the first and second shading masks 17 and 18 may be formed of any material capable of restricting the incident light, for example a black filter substance.

Referring to FIG. 4A, in the phase difference detecting units 100 in accordance with an embodiment, the first and second shading masks 17 and 18 in accordance with an embodiment may have openings 17A and 18A eccentrically disposed in a first direction, respectively. For example, the first direction may be a row direction or a horizontal direction, the first opening 17A may be eccentrically disposed in a right direction, and the second opening 18A may be eccentrically disposed in a left direction.

Referring to FIG. 4B, in the phase difference detecting units 100 in accordance with another embodiment, the first and second shading masks 17 and 18 may have openings 17A and 18A eccentrically disposed in a second direction perpendicular to the first direction, respectively. For example, the second direction may be a column direction or a vertical direction, the first opening 17A may be eccentrically disposed in a top side, and the second opening 18A may be eccentrically disposed in a bottom side.

For reference, forms and arrangements of the first and second openings 17A and 18A in the first and second shading masks 17 and 18 may vary according to arrangements of the phase difference detecting unit in a pixel array.

Figure 5:
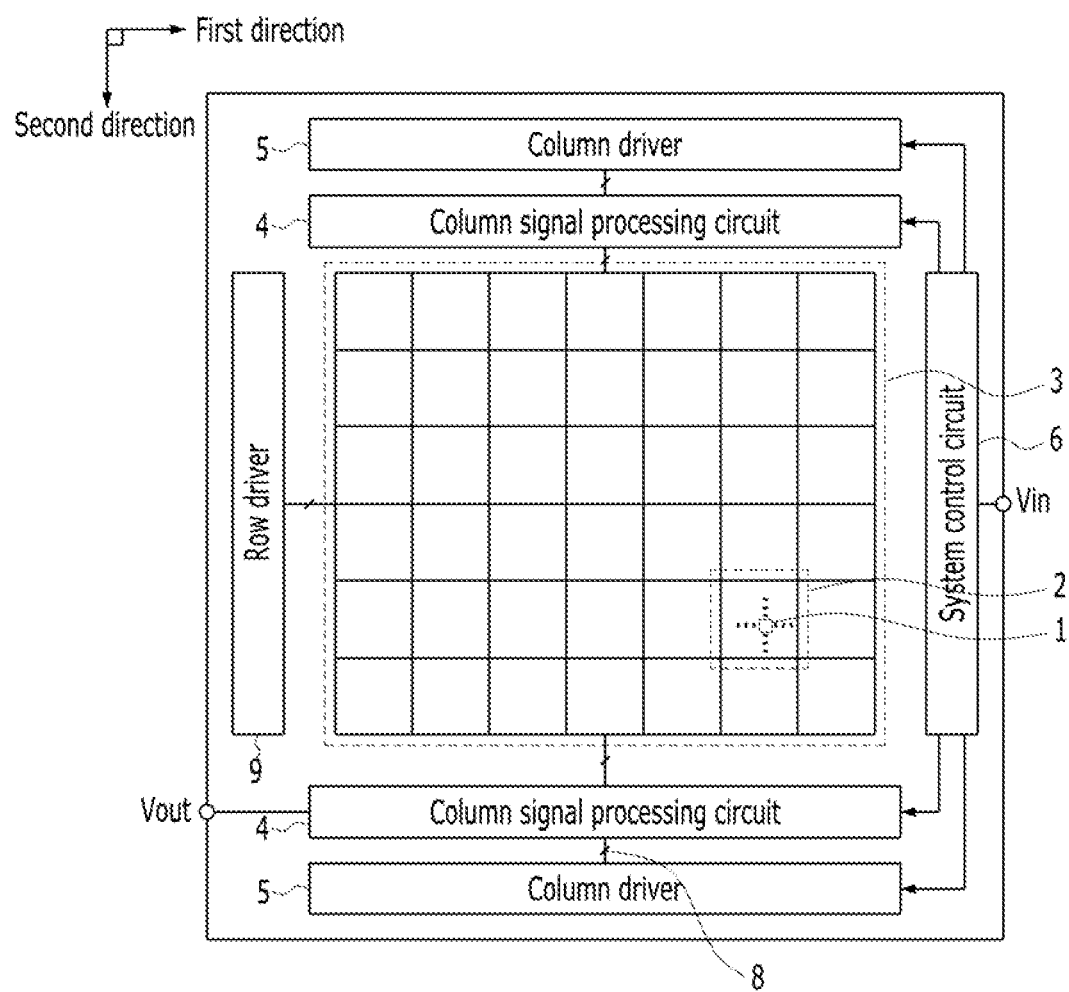
FIG. 5 is a diagram schematically illustrating an image sensor in accordance with an embodiment of the present invention.
Figure 6A:
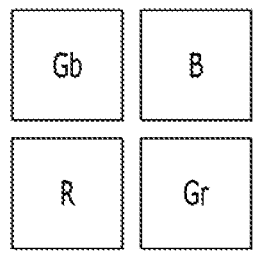
FIGS. 6A and 6B are plan views illustrating a unit pixel group of an image sensor in accordance with an embodiment of the present invention.
Figure 6B:
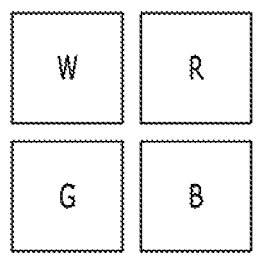

Next, a schematic construction of an image sensor in accordance with an embodiment of the present invention will be explained with reference to drawings. FIG. 5 is a plan view schematically illustrating an image sensor in accordance with an embodiment of the present invention. And, FIGS. 6A and 6b are plan views illustrating a unit pixel group of an image sensor in accordance with an embodiment of the present invention.

As illustrated in FIG. 5, the image sensor in accordance with an embodiment may include a pixel array 3 in which a plurality of pixels each including a photoelectric conversion element (not shown) are two-dimensionally arranged. Each of the pixels arranged in the pixel array 3 may be coupled to a pixel circuit (not illustrated) including a plurality of transistors and capacitors. A plurality of photoelectric conversion elements may share a part of the pixel circuit. Furthermore, the pixel circuit may be provided on the opposite surface to a surface on which the photoelectric conversion element is provided.

Around the pixel array 3, peripheral circuits may be arranged. The peripheral circuits may include a row driver 9, a column signal processing circuit 4, a column driver 5 and a system control circuit 6. The peripheral circuits may be formed on the same substrate as the pixel array 3. Alternatively, the peripheral circuits may be formed on a different substrate from the substrate on which the pixel array 3 is formed.

The row driver 9 may select any one among a plurality of row lines 7 arranged in the pixel array 3, supply a pulse signal for driving a pixel to the selected row line 7, and drive the pixels arranged in the pixel array 3 on a row basis. That is, the row driver 9 may sequentially and selectively scan the pixels arranged in the pixel array 3 in a second direction, that is, a vertical direction. Furthermore, through a column line 8 arranged perpendicular to the row line 7, a pixel signal may be generated based on a signal charge which is generated in response to the amount of light received by each pixel. The pixel signal may be supplied to the column signal processing circuit 4.

The column signal processing circuit 4 may be arranged at each pixel column, and process signals outputted from the respective pixel column coupled to the row line 7. For example, the column signal processing circuit 4 may perform noise reduction. That is, the column signal processing circuit 4 may perform Correlated Double Sampling ("CDS") for removing fixed pattern noise of pixels, signal amplification, or Analog/Digital Conversion ("ADC").

The column driver 5 may sequentially output scanning pulses in the first direction to sequentially select each of the column signal processing circuits 4, and control the column signal processing circuits 4 to output pixel signals. An output circuit may process the signals which are sequentially supplied to the respective column signal processing circuits 4, and output the processed signals. For example, the output circuit may perform only buffering or perform dark level adjustment, row deviation correction, and various digital signal processing operations.

The system control circuit 6 may receive an input clock and data indicating an operation mode or the like and output data such as, internal information of the image sensor. That is, the system control circuit 6 may generate a clock signal or control signal based on a vertical synchronization signal, a horizontal synchronization signal, and a master clock, which serve as a reference signal for the row driver 9, the column signal processing circuit 4, and the column driver 5. The system control circuit 6 may input the clock signal or control signal to the row driver 9, the column signal processing circuit 4, the column driver 5, and the like.

The pixel array 3 of the image sensor in accordance with the embodiments may have a two-dimensional arrangement in which unit pixel groups 1 having a 2×2 matrix are two-dimensionally arranged. Here, as shown in FIG. 6A, the unit pixel groups 1 having the 2×2 matrix may have a Bayer pattern in which red pixels R, green pixels Gr and Gb, and blue pixels B are repeatedly arranged in the 2×2 matrix. In the following embodiments, the unit pixel groups 1 will be described by an example of the Bayer pattern having the repeated RGr/GbB structures.

In another embodiment shown in FIG. 6B, the unit pixel group 1 may have a WRGB pattern in which white pixels W, red pixels R, green pixels G and blue pixels B are arranged.

The pixel array 3 in accordance with the embodiments may include a plurality of unit pixel arrays 2. Here, each of the plurality of unit pixel arrays 2 may include a plurality of unit pixel groups 1. That is, the plurality of unit pixel groups 1 may be two-dimensionally arranged in each of the plurality of unit pixel arrays 2. Each of the plurality of unit pixel arrays 2 may have a square shape in which the number of pixels arranged in the first direction is the same as the number of pixels in the second direction. For example, each of the plurality of unit pixel arrays 2 may have a 64×64 matrix or a 32×32 matrix.

As described above, the pixel array 3 of the image sensor may include the plurality of unit pixel arrays 2, and each of the plurality of unit pixel arrays 2 may include a plurality of phase difference detecting units 100. Each of the plurality of unit pixel arrays 2 may be a minimum array unit capable of performing a given operation. Therefore, in following embodiments, arrangement methods and arrangements of the phase difference detecting units 100 will be explained on a basis of the unit pixel arrays 2.

Figure 7:
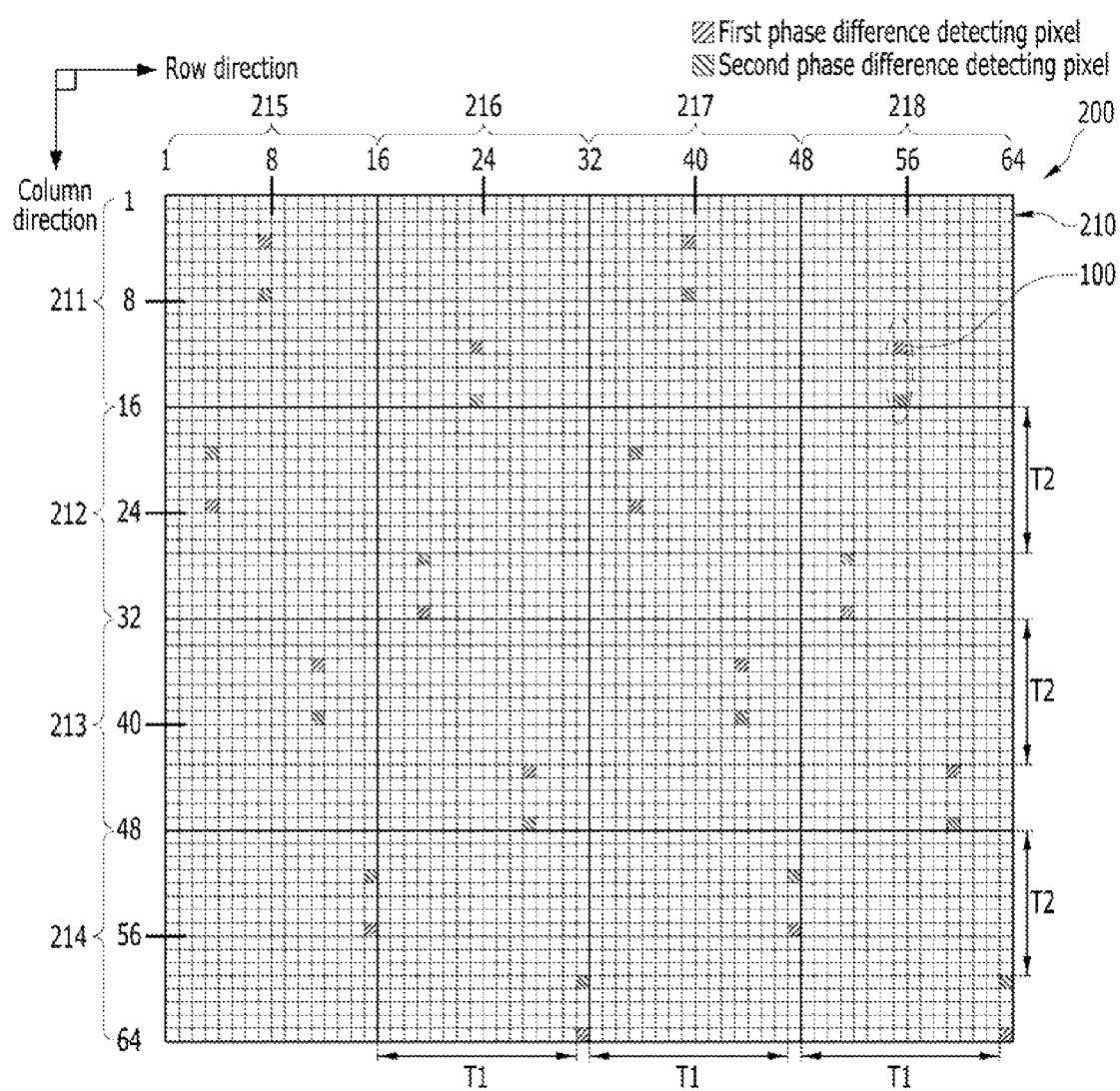
FIG. 7 is a diagram illustrating an image sensor in accordance with a first embodiment of the present invention.

FIG. 7 is a diagram illustrating an image sensor in accordance with a first embodiment of the present invention.

As shown in FIG. 7, the image sensor in accordance with the first embodiment may include a pixel array 3 including a plurality of unit pixel arrays 200. Each of the plurality of unit pixel arrays 200 may include a plurality of unit pixel blocks 210 arranged in a 4×4 matrix. A plurality of unit pixel groups 1 having a 2×2 matrix may be two-dimensionally arranged in the unit pixel arrays 200 and the plurality of unit pixel blocks 210. The unit pixel groups 1 may have a Bayer pattern in which red pixels R, green pixels Gr and Gb, and blue pixels B are repeatedly arranged.

For example, each of the plurality of unit pixel blocks 210 may have a 16×16 matrix, and have an 8×8 matrix based on the unit pixel groups 1. Moreover, the unit pixel arrays 200 may have a 64×64 matrix, and have a 32×32 matrix based on the unit pixel groups 1. As described below, sizes of the matrices of the unit pixel arrays 200 and the plurality of unit pixel blocks 210 may be adjusted according to whether a sub-sampling mode operation or a binning mode operation is supported or not.

One phase difference detecting units 100 may be arranged in each of the plurality of unit pixel blocks 210. The phase difference detecting units 100 may include a first phase difference detecting pixel 15 and a second phase difference detecting pixel 16 that have openings eccentrically disposed in different directions from each other. The first phase difference detecting pixel 15 and the second phase difference detecting pixel 16 may have openings eccentrically disposed in a row direction. See FIG. 4A. In another embodiment, the first phase difference detecting pixel 15 and the second phase difference detecting pixel 16 may include openings eccentrically disposed in a column direction. See FIG. 4B.

In the unit pixel arrays 200, the phase difference detecting units 100 may replace pixels having the same color. In other words, the phase difference detecting units 100 may be only arranged in any one of color pixels. For example, the first phase difference detecting pixel 15 and the second phase difference detecting pixel 16 arranged in each of the plurality of unit pixel blocks 210 may replace blue pixels. This is due to facilitating subsequent output signal processing of the phase difference detecting units 100 and image interpolation with respect to the phase difference detecting units 100.

In the image sensor in accordance with the first embodiment, the phase difference detecting units 100, which are arranged at each of the plurality of unit pixel blocks 210 are asymmetrical to each other on the basis of a boundary line between adjacent unit pixel blocks 210 in order to rapidly and uniformly detect a phase difference in a full frame and improve interpolation characteristics with respect to the phase difference detecting pixels. That is, when each of the plurality of unit pixel blocks 210 face each other on the basis of a boundary line between adjacent unit pixel blocks 210, the phase difference detecting unit 100 arranged in the unit pixel blocks 210 facing each other are arranged so as not to overlap with each other.

Specifically, the phase difference detecting units 100 included in a given unit pixel arrays 200 are located at different columns from each other. In other words, in the unit pixel arrays 200, the phase difference detecting units 100 arranged in the plurality of unit pixel blocks 210 may overlap with each other in the row direction, but may not overlap with each other in the column direction. For that purpose, the first phase difference detecting pixel 15 and the second phase difference detecting pixel 16 in a given phase difference detecting units 100 may be arranged at the column.

In the unit pixel arrays 200, a spacing between adjacent phase difference detecting units 100 in the row direction and the column direction, respectively, may be constant. Here, the adjacent phase difference detecting units 100 may have a first spacing T1 in the row direction, and a second spacing T2 smaller than the first spacing T1 in the column direction (T1>T2).

Moreover, in the unit pixel arrays 200, arrangements of the phase difference detecting units 100 which are arranged in each of the plurality of unit pixel blocks 210 on a basis of row lines 211, 212, 213 and 214 with respect to the plurality of unit pixel blocks 210 may be the same as each other. Further, the phase difference detecting units 100 which are arranged in the plurality of unit pixel blocks 210 positioned in the odd-numbered row lines 211 and 213 in the column direction may have the same arrangement as each other.

And, the phase difference detecting units 100 which are arranged in the plurality of unit pixel blocks 210 positioned in the even-numbered row lines 212 and 214 in the column direction may have the same arrangement as each other. Here, the arrangements of the phase difference detecting units 100 which are arranged in each of the plurality of unit pixel blocks 210 positioned in the even-numbered row lines 212 and 214 may be opposite to the arrangements of the phase difference detecting units 100 which are arranged in each of the plurality of unit pixel blocks 210 positioned in the odd-numbered row lines 211 and 213.

For example, the phase difference detecting units 100 which are arranged in the plurality of unit pixel blocks 210 positioned in the odd-numbered row lines 211 and 213 may be arranged in parallel with each other in order of the first phase difference detecting pixel 15 and the second phase difference detecting pixel 16 in the column direction.

And, the phase difference detecting units 100 which are arranged in the plurality of unit pixel blocks 210 positioned in the even-numbered row lines 212 and 214 may be arranged in parallel with each other in order of the second phase difference detecting pixel 16 and the first phase difference detecting pixel 15 in the column direction.

Furthermore, in the first embodiment described above, it is exemplified that none of the phase difference detecting units 100 arranged in the plurality of unit pixel blocks 210 are arranged at the same column. See FIG. 7. As a modification of the first embodiment, it is possible that none of the phase difference detecting units 100 arranged in the plurality of unit pixel blocks 210 is arranged in the same row. This will be explained with reference to FIG. 8.

Figure 8:
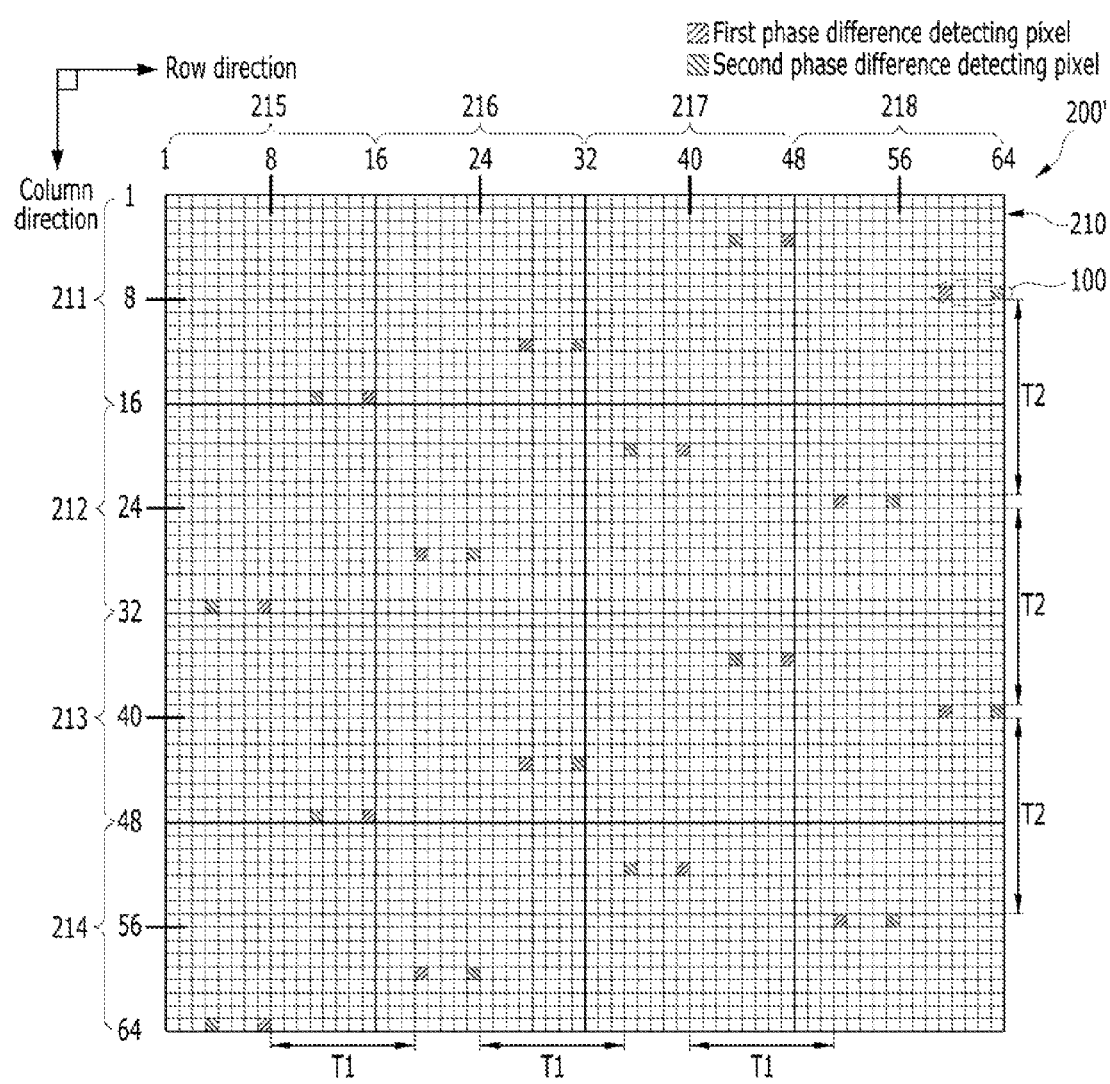
FIG. 8 is a diagram illustrating a modification of the image sensor in accordance with the first embodiment of the present invention.

FIG. 8 is a diagram illustrating a modification of the image sensor in accordance with the first embodiment of the present invention.

As shown in FIG. 8, in the modification of the image sensor in accordance with the first embodiment, the phase difference detecting units 100 arranged in the plurality of unit pixel blocks 210 in a unit pixel array 200' may be located at the same column. However, none of the phase difference detecting units 100 is located at the same row.

In FIG. 8, the first phase difference detecting pixel 15 and the second phase difference detecting pixel 16 may be arranged in parallel with each other in the row direction. That is, the first phase difference detecting pixel 15 and the second phase difference detecting pixel 16 may be located at different columns and at the same row. A spacing between adjacent phase difference detecting units 100 in the row direction and the column direction, respectively, in the unit pixel arrays 200' may be constant. Here, the adjacent phase difference detecting units 100 may have a first spacing T1 in the row direction, and a second spacing T2 larger than the first spacing T1 in the column direction (T2>T1).

Furthermore, in the unit pixel arrays 200', arrangements of the phase difference detecting units 100 arranged in the plurality of unit pixel blocks 210 may be the same as each other on a basis of column lines 215, 216, 217 and 218 with respect to the plurality of unit pixel blocks 210. And, the phase difference detecting units 100 which are arranged in the plurality of unit pixel blocks 210 positioned in the odd-numbered column lines 215 and 217 may have the same arrangement as each other. Further, the phase difference detecting units 100 which are arranged in the plurality of unit pixel blocks 210 positioned in the even-numbered column lines 216 and 218 may have the same arrangement as each other.

Here, the arrangements of the phase difference detecting units 100 which are arranged in the plurality of unit pixel blocks 210 positioned in the even-numbered column lines 216 and 218 may be opposite to the arrangements of the phase difference detecting units 100 which are arranged in each of the plurality of unit pixel blocks 210 positioned in the odd-numbered column lines 215 and 217. For example, the phase difference detecting units 100 which are arranged in the plurality of unit pixel blocks 210 positioned in the odd-numbered column lines 215 and 217 may be arranged in parallel with each other in order of the first phase difference detecting pixel 15 and the second phase difference detecting pixel 16 in the row direction. And, the phase difference detecting units 100 which are arranged in the plurality of unit pixel blocks 210 positioned in the even-numbered column lines 216 and 218 may be arranged in parallel with each other in order of the second phase difference detecting pixel 16 and the first phase difference detecting pixel 15 in the row direction.

Hereinafter, a method for implementing the image sensor in accordance with the first embodiment described above, that is, a method for arranging the plurality of phase difference detecting units 100 in the unit pixel arrays 200 will be explained with reference to drawings.

On the other hand, recently, researches on an image sensor simultaneously performing a full mode operation and a sub-sampling operation have been conducted. The full mode operation means an operation for sensing an image by using information of all pixels in the pixel array 3. While, the sub-sampling mode operation means an operation for sensing an image not by using information of all pixels in the pixel array 3 but by collecting information in the selected pixels to form a single collected information and then using the collected information. Therefore, according to whether the sub-sampling mode operation is supported or not, arrangements and methods of the phase difference detecting units 100 may vary. Thus, in the following arrangement methods, it will be exemplified that the sub-sampling mode operation is supported. In addition, a difference according to whether the sub-sampling mode operation is supported or not will be also explained. For a reference, arrangements and methods of the phase difference detecting units 100 in accordance with embodiments of the present invention may be applied to an image sensor in which a binning mode operation similar to the sub-sampling mode operation is supported.

Figure 9:
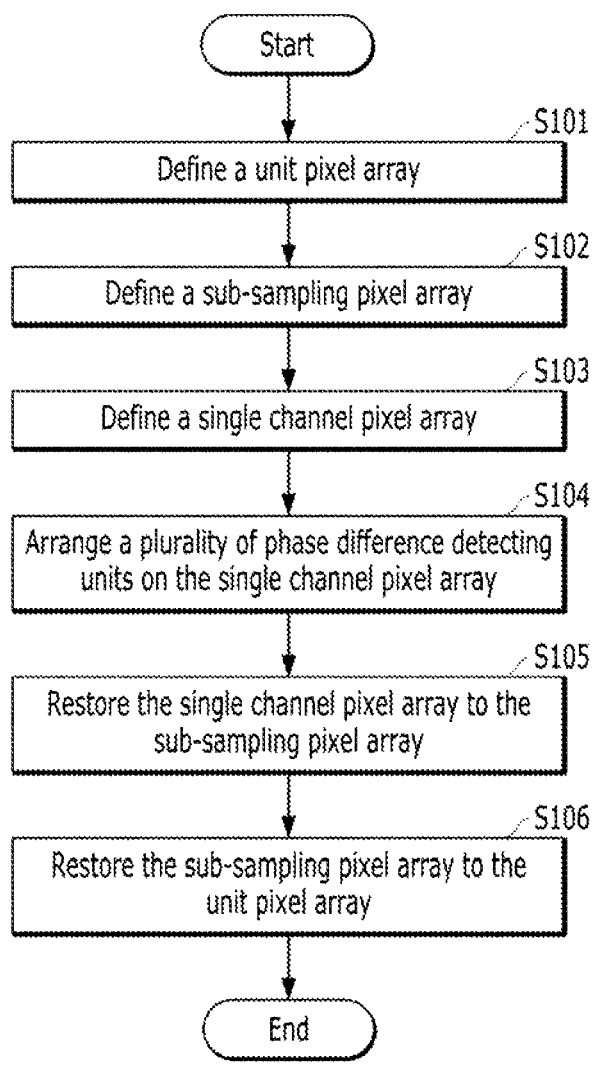
FIG. 9 is a flow-chart illustrating a method for arranging a phase difference detecting unit in accordance with an embodiment of the present invention.

FIG. 9 is a flow-chart illustrating a method for arranging a phase difference detecting unit in accordance with an embodiment of the present invention. And, FIGS. 10A to 10F are diagrams illustrating an array change in accordance with the respective steps of FIG. 9.

Figure 10A:
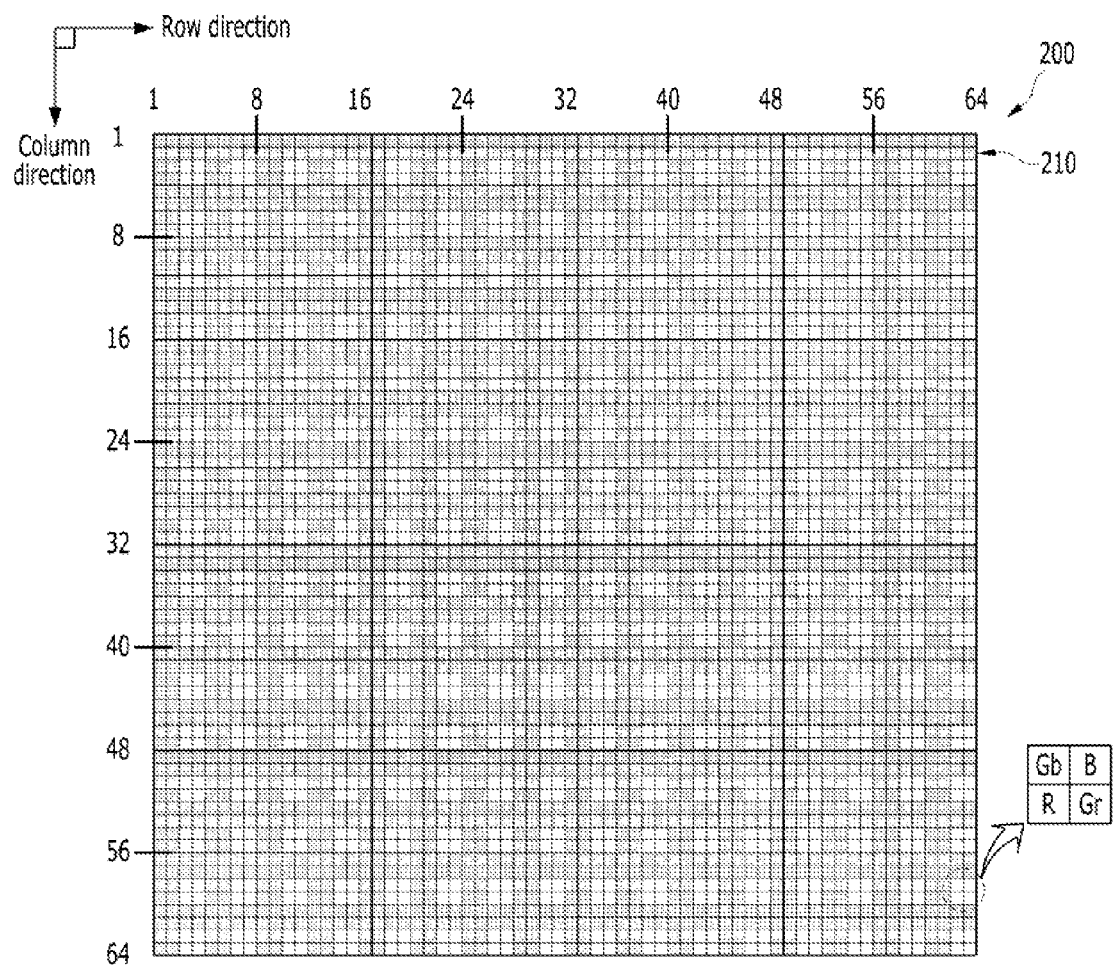
FIGS. 10A to 10F are diagrams illustrating an array change in accordance with the respective steps of FIG. 9.

As shown in FIGS. 9 and 10A, the plurality of unit pixel arrays 200 may be defined (S101). The unit pixel arrays 200 may include the plurality of unit pixel blocks 210 arranged in a 4×4 matrix. In the unit pixel arrays 200 and the plurality of unit pixel blocks 210, the plurality of unit pixel groups 1 having a 2×2 matrix may be two-dimensionally arranged. The unit pixel groups 1 may have an RGr/GbB Bayer pattern in which red pixels R, green pixels Gr and Gb, and blue pixels B are repeatedly arranged.

According to whether the sub-sampling mode operation is supported or not, sizes of matrices of the unit pixel arrays 200 and the plurality of unit pixel blocks 210 may be different. Here, sizes of matrices of the unit pixel arrays 200 and the plurality of unit pixel blocks 210 may be determined according to the skipped pixels in the sub-sampling mode operation. An example of the skipped pixels in the sub-sampling mode operation is indicated by shading in FIG. 10A. Referring to FIG. 10A, when the sub-sampling mode operation is supported, the unit pixel arrays 200 may have a 64×64 matrix. When the sub-sampling mode operation is not supported, the unit pixel arrays 200 may have a 32×32 matrix. Such sizes of the matrices may be due to a method for performing the sub-sampling mode operation.

Figure 10B:
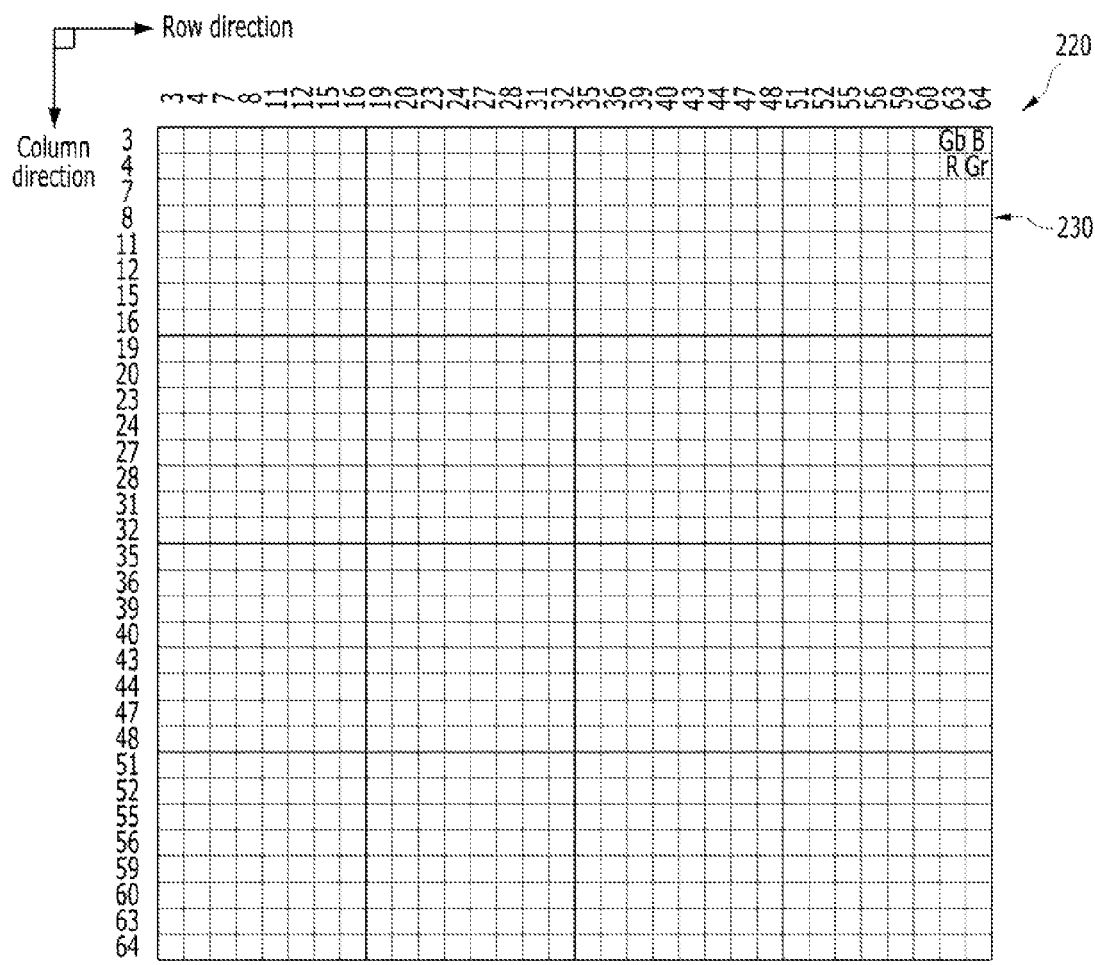

As shown in FIGS. 9 and 10B, a sub-sampling pixel array 220 may be defined from the unit pixel arrays 200 taking into consideration the sub-sampling mode operation (S102). The sub-sampling pixel array 220 may include a plurality of sub-sampling pixel blocks 230. And, in the sub-sampling pixel array 220, the plurality of sub-sampling pixel block 230 may be arranged in a 4×4 matrix.

The sub-sampling pixel array 220 means the unit pixel arrays 200 excluding skipped pixels. The reason for defining the sub-sampling pixel array 220 is to prevent the phase difference detecting units 100 from being arranged in positions of the skipped pixels in the sub-sampling mode operation, that is, to utilize the phase difference detecting units 100 in the sub-sampling mode operation.

For example, the sub-sampling mode operation may be performed by skipping every two rows and every two columns and sensing every two rows between the skipped rows and every two columns between the skipped columns. See FIG. 10A. In this case, the sub-sampling pixel array 220 may have a 32×32 matrix, and each of the plurality of sub-sampling pixel blocks 230 may have an 8×8 matrix.

Figure 10C:
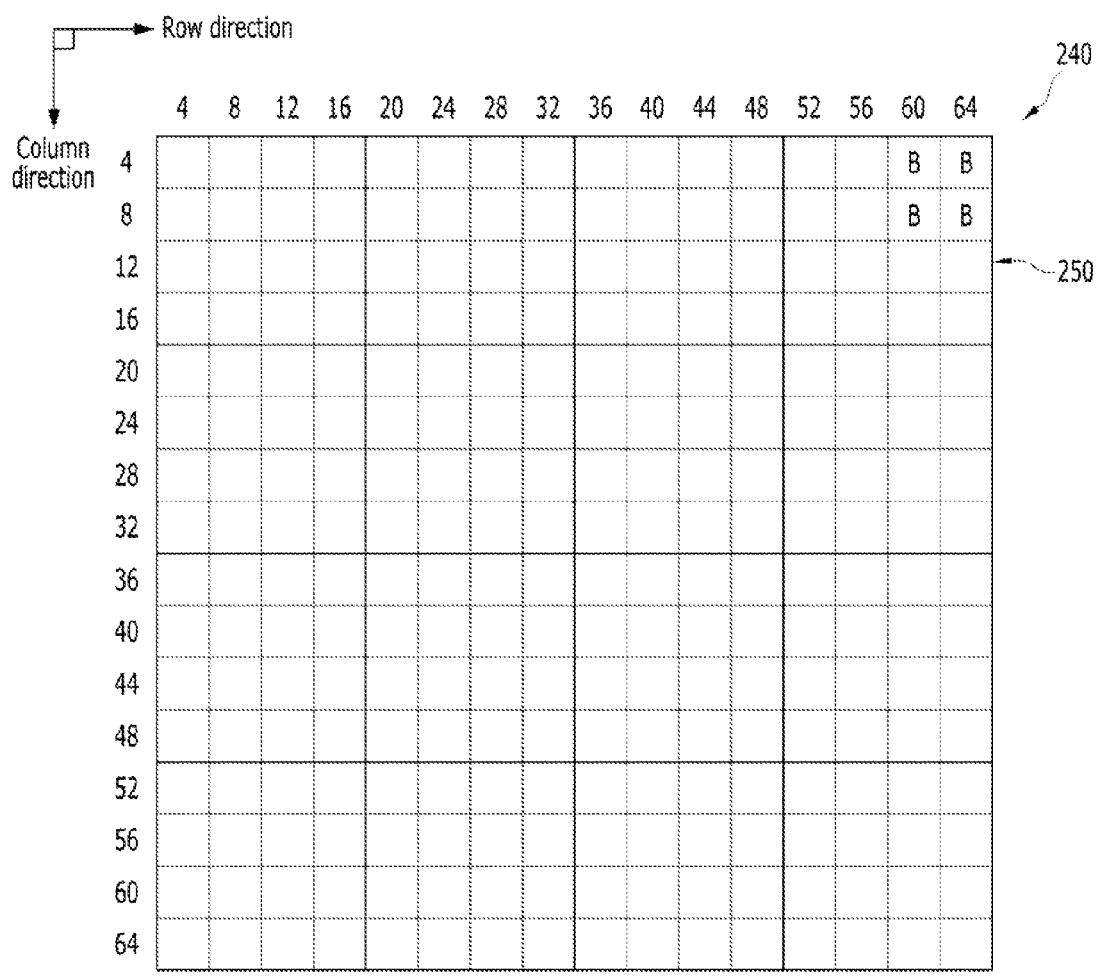

As shown in FIGS. 9 and 10C, a single channel pixel array 240 may be extracted from the sub-sampling pixel array 220 (S103). Accordingly, the single channel pixel array 240 may include a plurality of single channel pixel blocks 250.

Moreover, in the single channel pixel array 240, the plurality of single channel pixel blocks 250 may be arranged in a 4×4 matrix.

The single channel pixel array 240 may mean an array formed by pixels extracted in the same position as each other from each of the plurality of unit pixel groups 1 in the sub-sampling pixel array 220 in which the plurality of unit pixel groups 1 respectively having a 2×2 matrix are two-dimensionally arranged. That is, the single channel pixel array 240 may be an array formed by the same color pixels which are selected from each of the plurality of unit pixel groups 1. For example, when the unit pixel groups 1 have an RGr/GbB Bayer pattern, the single channel pixel array 240 and the plurality of single channel pixel blocks 250 may be formed by the blue pixels B.

When the sub-sampling mode operation is not supported, the single channel pixel array 240 may be extracted from the unit pixel arrays 200.

Figure 10D:
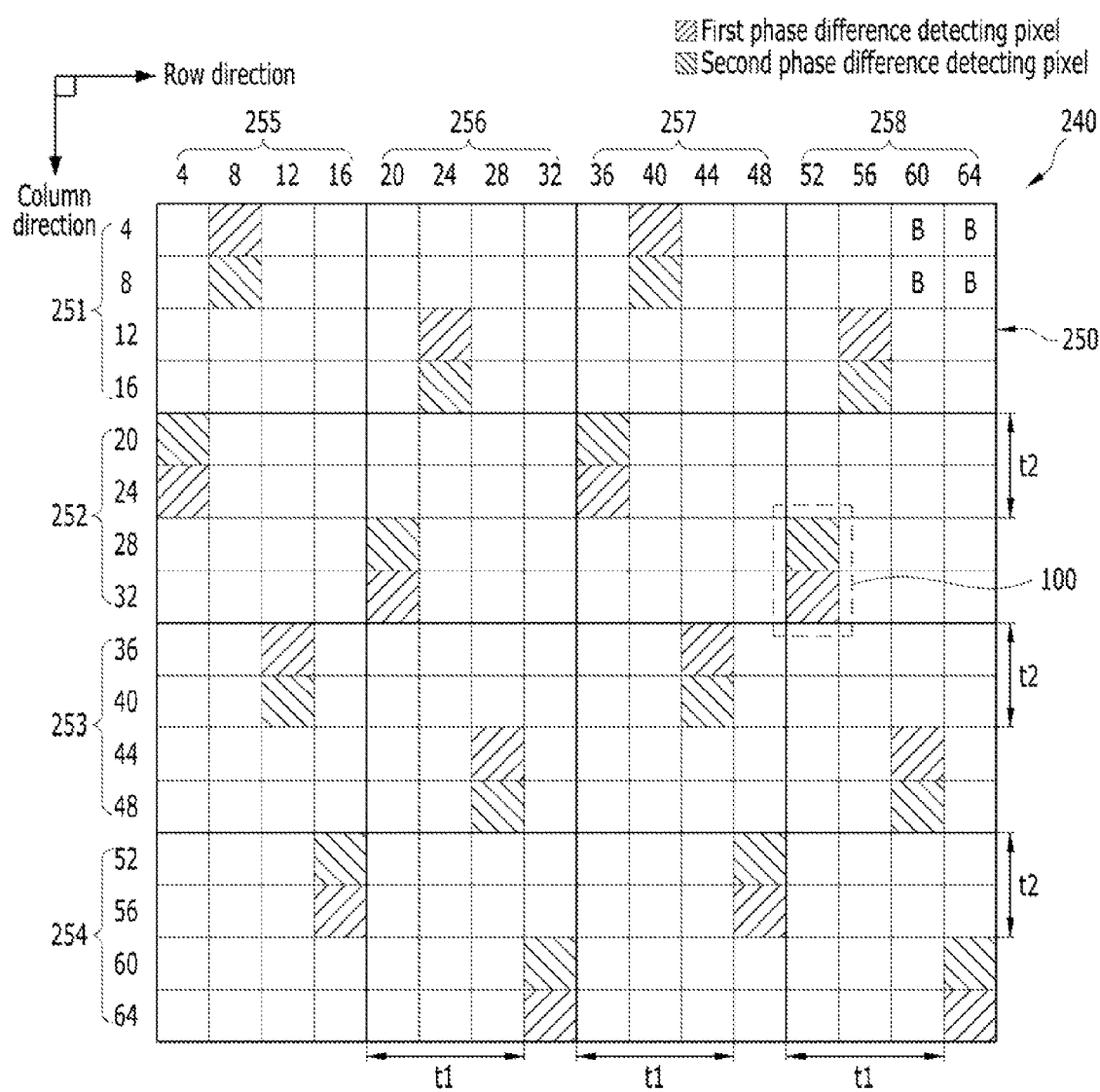

As shown in FIGS. 9 and 10D, the plurality of phase difference detecting units 100 may be arranged in the single channel pixel array 240 (S104). The plurality of phase difference detecting units 100 are arranged in a single channel pixel array 240 to facilitate subsequent output signal processing of the phase difference detecting units 100 and image interpolation with respect to the phase difference detecting units 100.

Each phase difference detecting units 100 may be arranged in each of the plurality of single channel pixel blocks 250. Here, in the single channel pixel array 240, the phase difference detecting units 100 arranged in each of the plurality of single channel pixel blocks 250 may be arranged so as not to overlap with each other in the column direction. For that purpose, the first phase difference detecting pixel 15 and the second phase difference detecting pixel 16 may be arranged in parallel with each other in the column direction.

In the single channel pixel array 240, spacings between adjacent phase difference detecting units 100 in the row direction and in the column direction, respectively, may be constant. The adjacent phase difference detecting units 100 may have a first spacing t1 in the row direction, and a second spacing t2 smaller than the first spacing t1 in the column direction (t1>t2).

Moreover, arrangements of the phase difference detecting units 100 which are arranged in each of the plurality of single channel pixel blocks 250 on a basis of row lines 251, 252, 253 and 254 with respect to the plurality of single channel pixel blocks 250 in the single channel pixel array 240 may be the same as each other. And, the phase difference detecting units 100 which are arranged in each of the plurality of single channel pixel blocks 250 positioned in the odd-numbered row lines 251 and 253 in the column direction may have the same arrangement as each other. Further, the phase difference detecting units 100 which are arranged in each of the plurality of single channel pixel blocks 250 positioned in the even-numbered row lines 252 and 254 in the column direction may have the same arrangement as each other.

Here, arrangements of the phase difference detecting units 100 which are arranged in each of the plurality of single channel pixel blocks 250 positioned in the even-numbered row lines 252 and 254 may be opposite to arrangements of the phase difference detecting units 100 which are arranged in each of the plurality of single channel pixel blocks 250 positioned in the odd-numbered row lines 251 and 253. For example, the phase difference detecting units 100 which are arranged in each of the plurality of single channel pixel blocks 250 positioned in the odd-numbered row lines 251 and 253 may be arranged in parallel with each other in order of the first phase difference detecting pixel 15 and the second phase difference detecting pixel 16 in the column direction. And, the phase difference detecting units 100 which are arranged in each of the plurality of single channel pixel blocks 250 positioned in the even-numbered row lines 252 and 254 may be arranged in parallel with each other in order of the second phase difference detecting pixel 16 and the first phase difference detecting pixel 15 in the column direction.

As described above, arrangement characteristics of the phase difference detecting units 100 in the unit pixel arrays 200 shown in FIG. 7 and arrangement characteristics of the phase difference detecting units 100 in the single channel pixel array 240 shown in FIG. 10D are substantially the same as each other. The reason is that a spacing ratio between the phase difference detecting units 100 and a spacing ratio between the first phase difference detecting pixel 15 and the second phase difference detecting pixel 16 are constant although the arrangement characteristics are different from each other in a spacing between the phase difference detecting units 100 and a spacing between the first phase difference detecting pixel 15 and the second phase difference detecting pixel 16.

Figure 11:
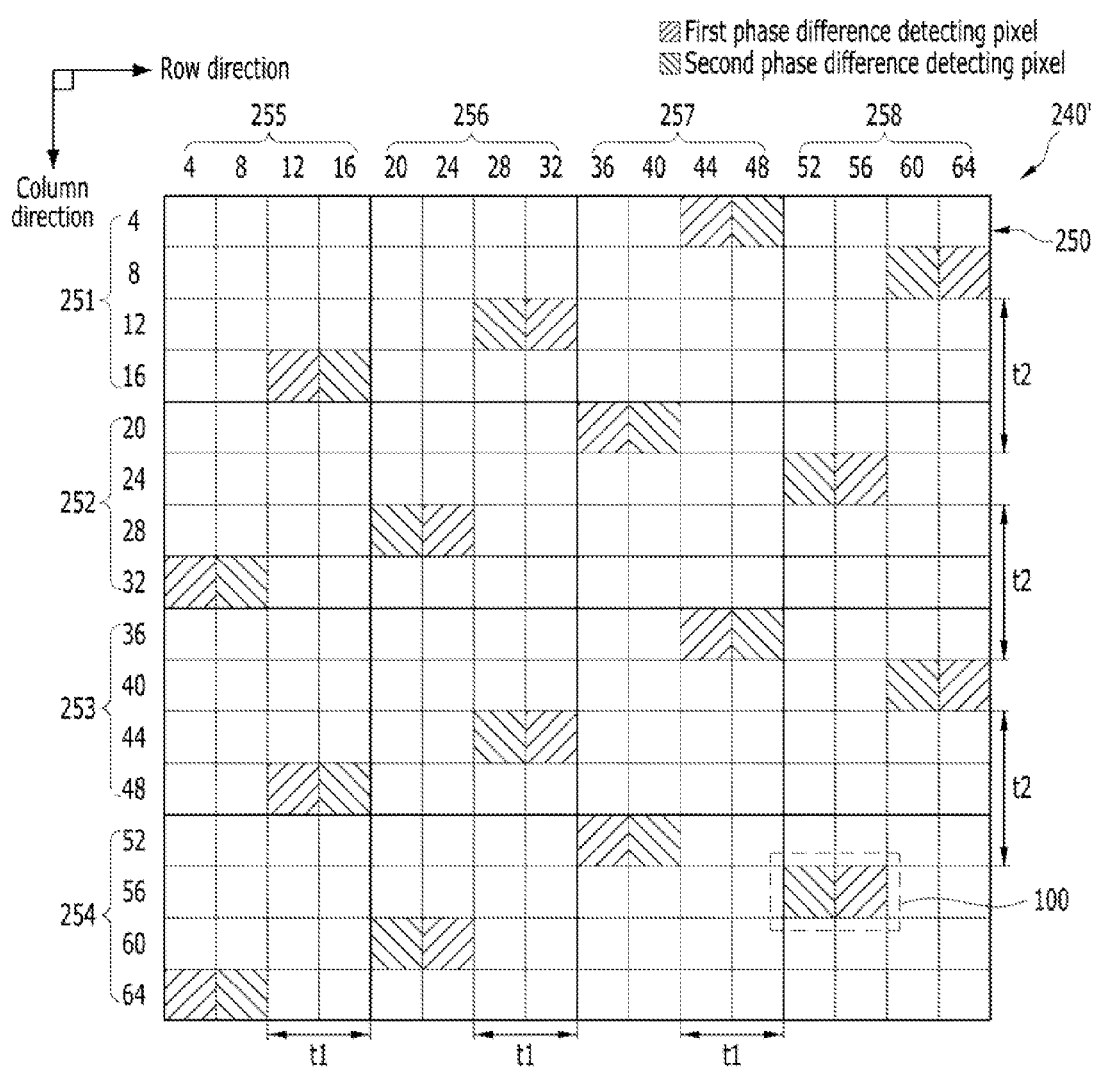
FIG. 11 is a diagram illustrating a modification of the image sensor in accordance with the first embodiment of the present invention.

FIG. 11 illustrates that an arrangement of the phase difference detecting units 100 in the unit pixel arrays 200' (see FIG. 8) of the image sensor in accordance with the modification of the first embodiment shown in FIG. 8 is converted into an arrangement in the single channel pixel array 240'.

FIG. 11 is a diagram illustrating a modification of the image sensor in accordance with the first embodiment of the present invention. As shown in FIG. 11, in the modification of the image sensor in accordance with the first embodiment, each phase difference detecting units 100 may be arranged in each of the plurality of single channel pixel blocks 250. Here, in the single channel pixel array 240', the phase difference detecting units 100 arranged in the plurality of single channel pixel blocks 250 may be arranged so as not to overlap with each other in the row direction. For that purpose, the first phase difference detecting pixel 15 and the second phase difference detecting pixel 16 may be arranged in parallel with each other in the row direction. In single channel pixel array 240', spacings between adjacent phase difference detecting units 100 in the row direction and the column direction, respectively, may be constant. The adjacent phase difference detecting units 100 may have a first spacing t1 in the row direction and a second spacing t2 larger than the first spacing t1 in the column direction (t1<t2).

Also, in the single channel pixel array 240', arrangements of the phase difference detecting units 100 which are arranged in the plurality of single channel pixel blocks 250 on a basis of column lines 255, 256, 257 and 258 with respect to the plurality of single channel pixel blocks 250 may be the same as each other. Moreover, the phase difference detecting units 100 which are arranged in the plurality of single channel pixel blocks 250 positioned in the odd-numbered column lines 255 and 257 in the row direction may have the same arrangement as each other. And, the phase difference detecting units 100 which are arranged in the plurality of single channel pixel blocks 250 positioned in the even-numbered column lines 256 and 258 in the row direction may have the same arrangement as each other.

The arrangements of the phase difference detecting units 100 which are arranged in the plurality of single channel pixel blocks 250 positioned in the even-numbered column lines 256 and 2587 may be opposite to the arrangements of the phase difference detecting units 100 which are arranged in the plurality of single channel pixel blocks 250 positioned in the odd-numbered column lines 255 and 257. For example, the phase difference detecting units 100 which are arranged in the plurality of single channel pixel blocks 250 positioned in the odd-numbered column lines 255 and 257 may be arranged in parallel with each other in order of the first phase difference detecting pixel 15 and the second phase difference detecting pixel 16 in the row direction. And, the phase difference detecting units 100 which are arranged in the plurality of single channel pixel blocks 250 positioned in the even-numbered column lines 256 and 258 may be arranged in parallel with each other in order of the second phase difference detecting pixel 16 and the first phase difference detecting pixel 15 in the row direction.

As described above, arrangement characteristics of the phase difference detecting units 100 in the unit pixel arrays 200' shown in FIG. 8 and arrangement characteristics of the phase difference detecting units 100 in the single channel pixel array 240' shown in FIG. 11 are substantially the same as each other. The reason is that a spacing ratio between the phase difference detecting units 100 and a spacing ratio between the first phase difference detecting pixel 15 and the second phase difference detecting pixel 16 are constant although the arrangement characteristics are different from each other in a spacing between the phase difference detecting units 100 and a spacing between the first phase difference detecting pixel 15 and the second phase difference detecting pixel 16.

Figure 10E:
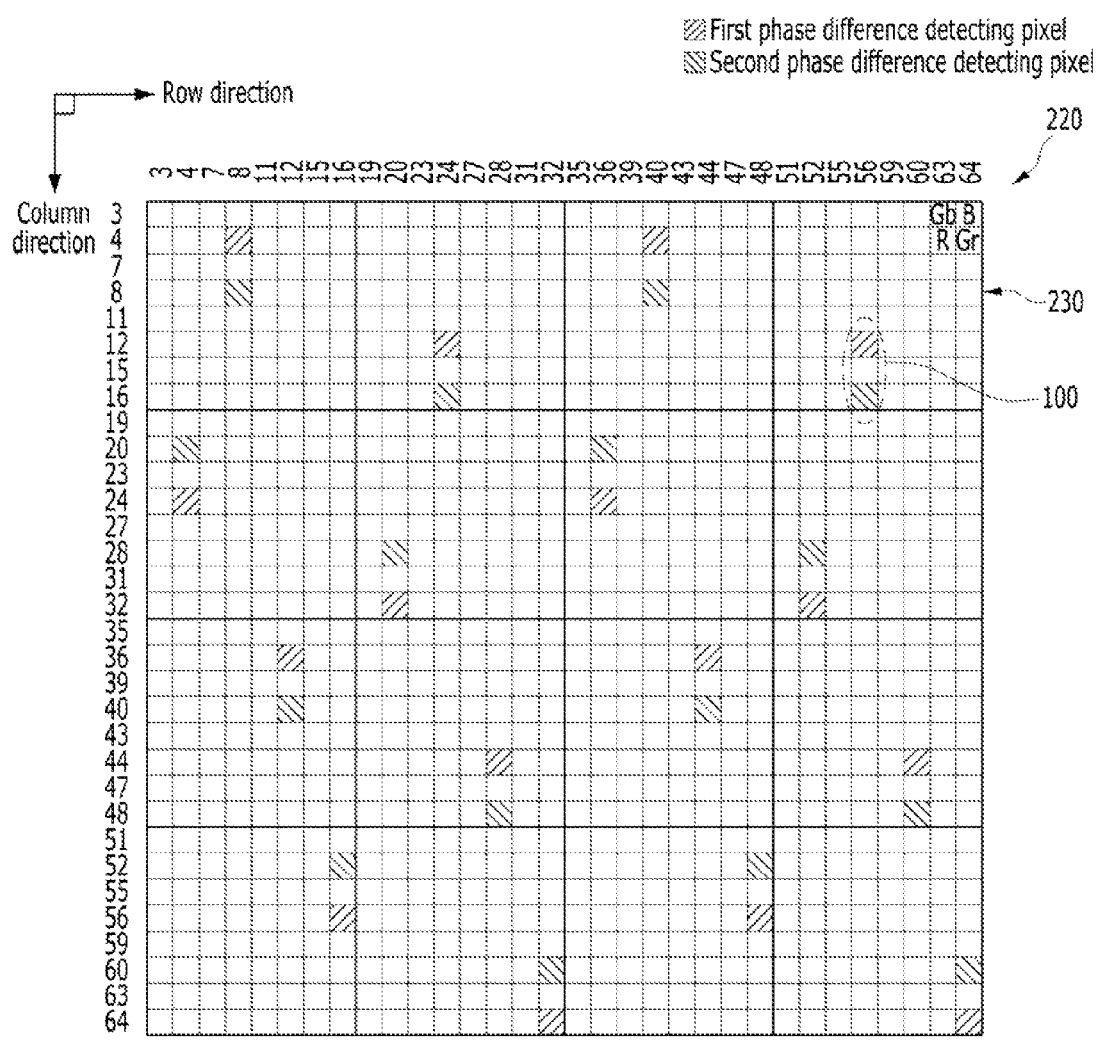

As shown in FIGS. 9 and 10E, the single channel pixel array 240 in which the plurality of phase difference detecting units 100 are arranged is restored to the sub-sampling pixel array 220 (S105). The restored sub-sampling pixel array 220 may include the plurality of sub-sampling pixel blocks 230 arranged in a 4×4 matrix, and each phase difference detecting units 100 may be arranged in each of the plurality of sub-sampling pixel block 230.

Figure 10F:
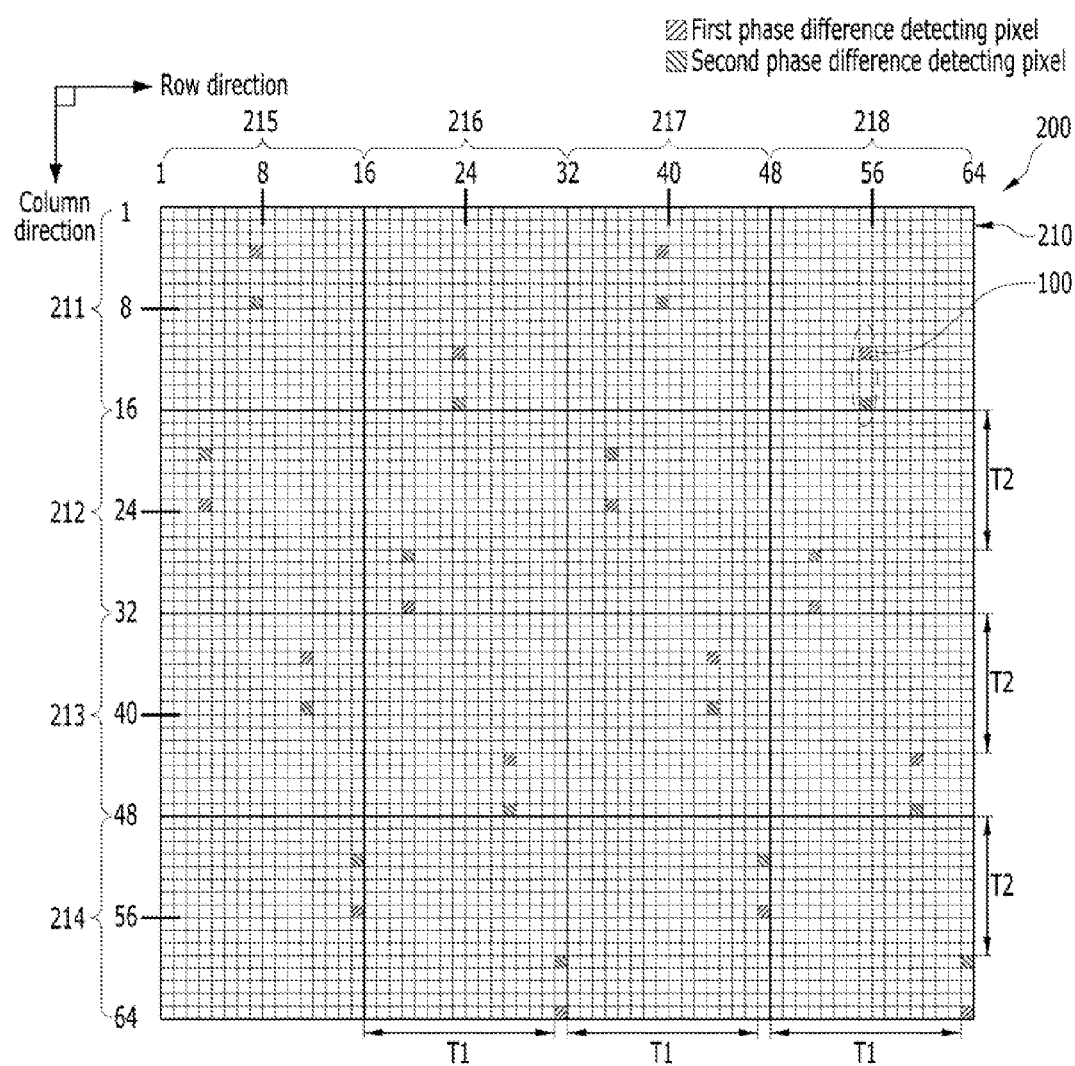

As shown in FIGS. 9 and 10F, the sub-sampling pixel array 220 in which the plurality of phase difference detecting units 100 are arranged is restored to the unit pixel arrays 200 (S106). The restored unit pixel arrays 200 may include the plurality of unit pixel blocks 210 arranged in a 4×4 matrix, and each phase difference detecting units 100 may be arranged in each of the plurality of unit pixel blocks 210.

Through the procedures described above, optimized arrangements may be provided in the unit pixel arrays 200 shown in FIG. 7. As such, it is possible to rapidly and uniformly detect a phase difference in a full frame and improve interpolation characteristics with respect to the phase difference detecting pixels.

Hereinafter, various embodiments having the same arrangement characteristics as that of the phase difference detecting units 100 of the image sensor in accordance with the first embodiment will be described with reference to drawings.

Figure 12:
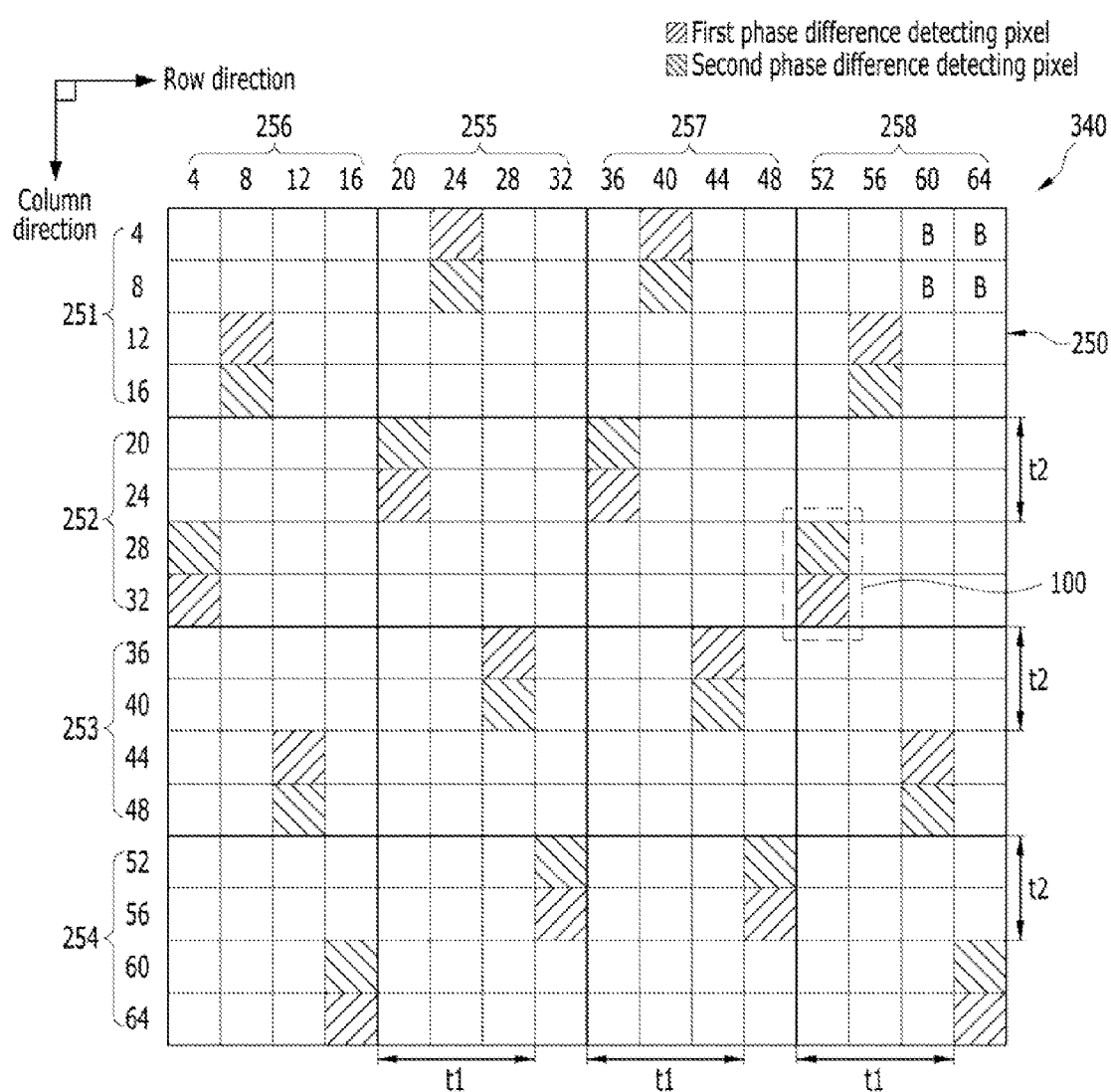
FIGS. 12 and 13 are diagrams illustrating an arrangement of a phase difference detecting unit in accordance with a second embodiment of the present invention.
Figure 13:
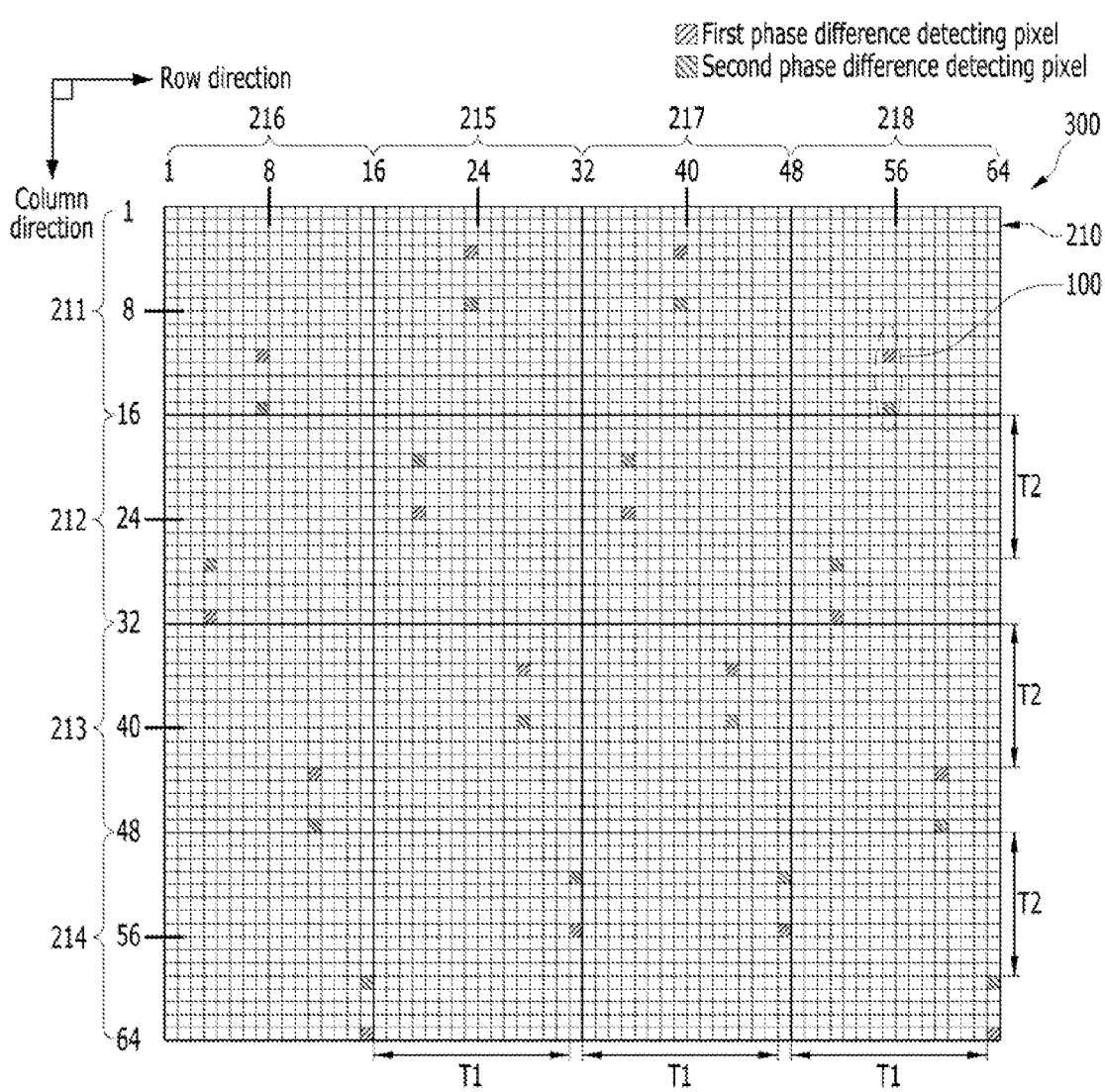

FIGS. 12 and 13 are diagrams illustrating an arrangement of a phase difference detecting unit in accordance with a second embodiment of the present invention. FIG. 12 is a plan view illustrating an arrangement of a phase difference detecting unit in a single pixel array, and FIG. 13 is a plan view illustrating an arrangement of a phase difference detecting unit in a unit pixel array.

As shown in FIGS. 12 and 13, a unit pixel array 300 of the image sensor in accordance with the second embodiment may correspond to the unit pixel arrays 200 of the image sensor in accordance with the first embodiment except for the location of the phase difference detecting units 100. In the first embodiment, the phase difference detecting unit 100 is positioned in the first column line 215 in the row direction. See FIG. 10D. In contrast, in the second embodiment, the phase difference detecting unit 100 is positioned in the second column line 216 in the row direction. See FIG. 13.

Therefore, a single channel pixel array 340 of the image sensor in accordance with the second embodiment may correspond to the single channel pixel array 240 of the image sensor in accordance with the first embodiment except for the positions of the phase difference detecting units 100. In the first embodiment, the phase difference detecting unit 100 is positioned in the first column line 255 in the row direction. See FIG. 10D. In contrast, in the second embodiment, the phase difference detecting unit 100 is positioned in the second column line 256 in the row direction. See FIG. 12.

Since the image sensor in accordance with the second embodiment has the same arrangement characteristics as the image sensor in accordance with the first embodiment, it is possible to improve performance of the image sensor.

Figure 14:
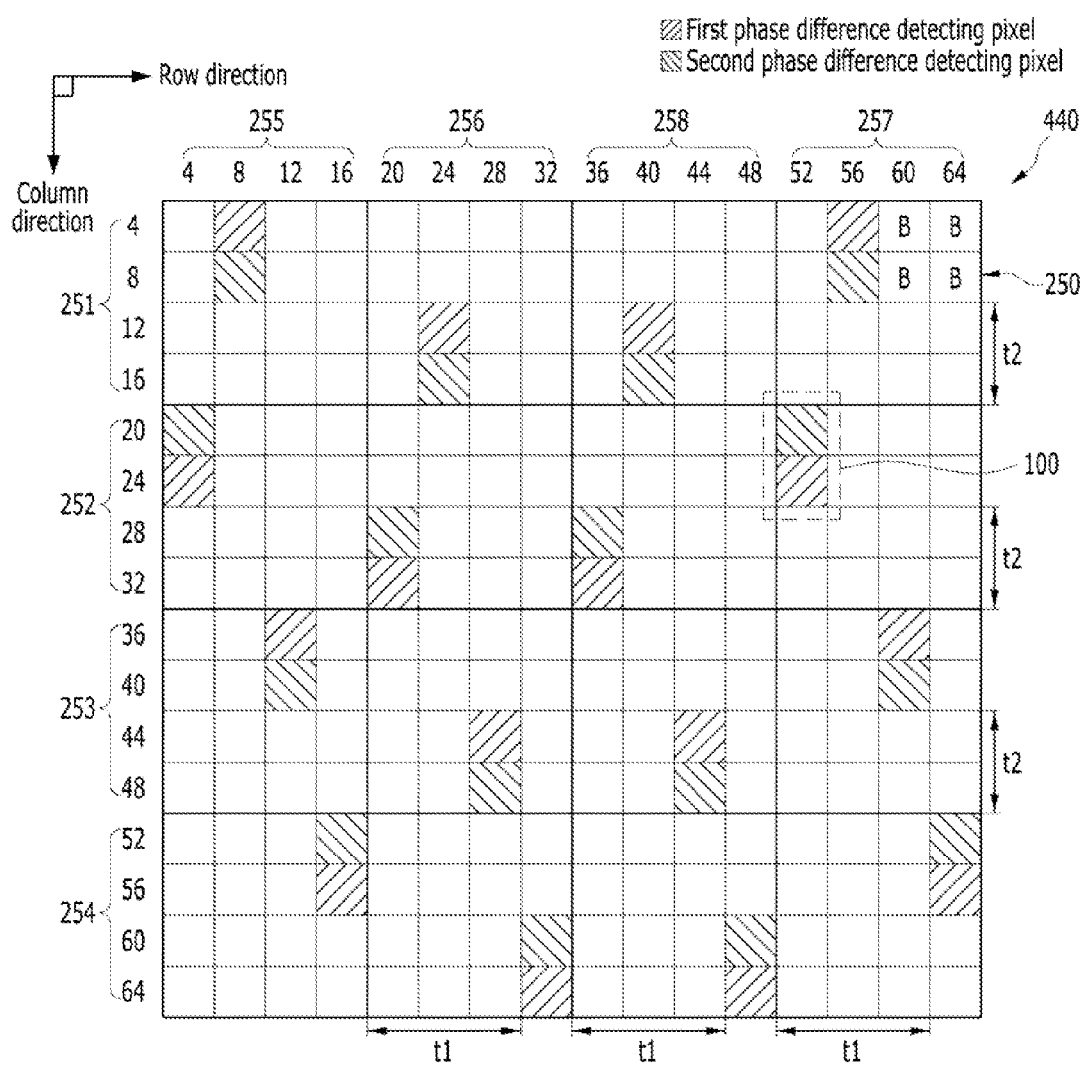
FIGS. 14 and 15 are diagrams illustrating an arrangement of a phase difference detecting unit in accordance with a third embodiment of the present invention.
Figure 15:
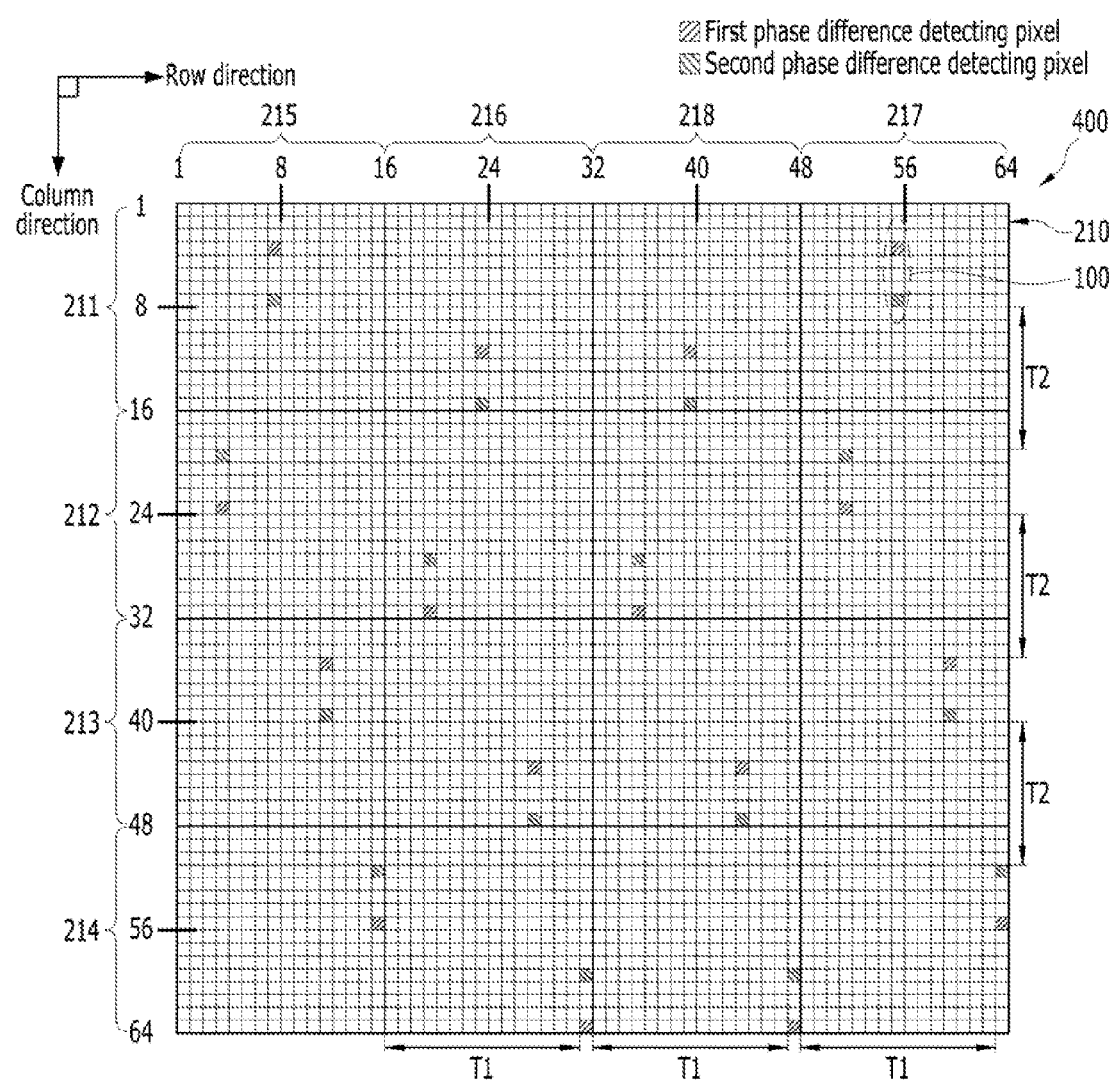

FIGS. 14 and 15 are diagrams illustrating an arrangement of a phase difference detecting unit in accordance with a third embodiment of the present invention. FIG. 14 is a plan view illustrating an arrangement of a phase difference detecting unit in a single channel pixel array, and FIG. 15 is a plan view illustrating an arrangement of a phase difference detecting unit in a unit pixel array.

As shown in FIGS. 14 and 15, a unit pixel array 400 of the image sensor in accordance with the third embodiment may correspond to the unit pixel arrays 200 of the image sensor in accordance with the first embodiment except the positions of the phase difference detecting units 100. In the first embodiment, the phase difference detecting units 100 is positioned in the third column line 217 in the row direction. In contrast, in the third embodiment, the phase difference detecting unit 100 is positioned in the fourth column line 218 in the row direction.

Therefore, a single channel pixel array 440 of the image sensor in accordance with the third embodiment may correspond to the single channel pixel array 240 of the image sensor in accordance with the first embodiment except for positions of the phase difference detecting units 100. In the first embodiment, the phase difference detecting unit 100 is positioned in the third column line 257 in the row direction. In contrast, in the third embodiment, the phase difference detecting unit 100 is positioned in the fourth column line 258 in the row direction.

Since the image sensor in accordance with the third embodiment has the same arrangement characteristics as the image sensor in accordance with the first embodiment, it is possible to improve performance of the image sensor.

Figure 16:
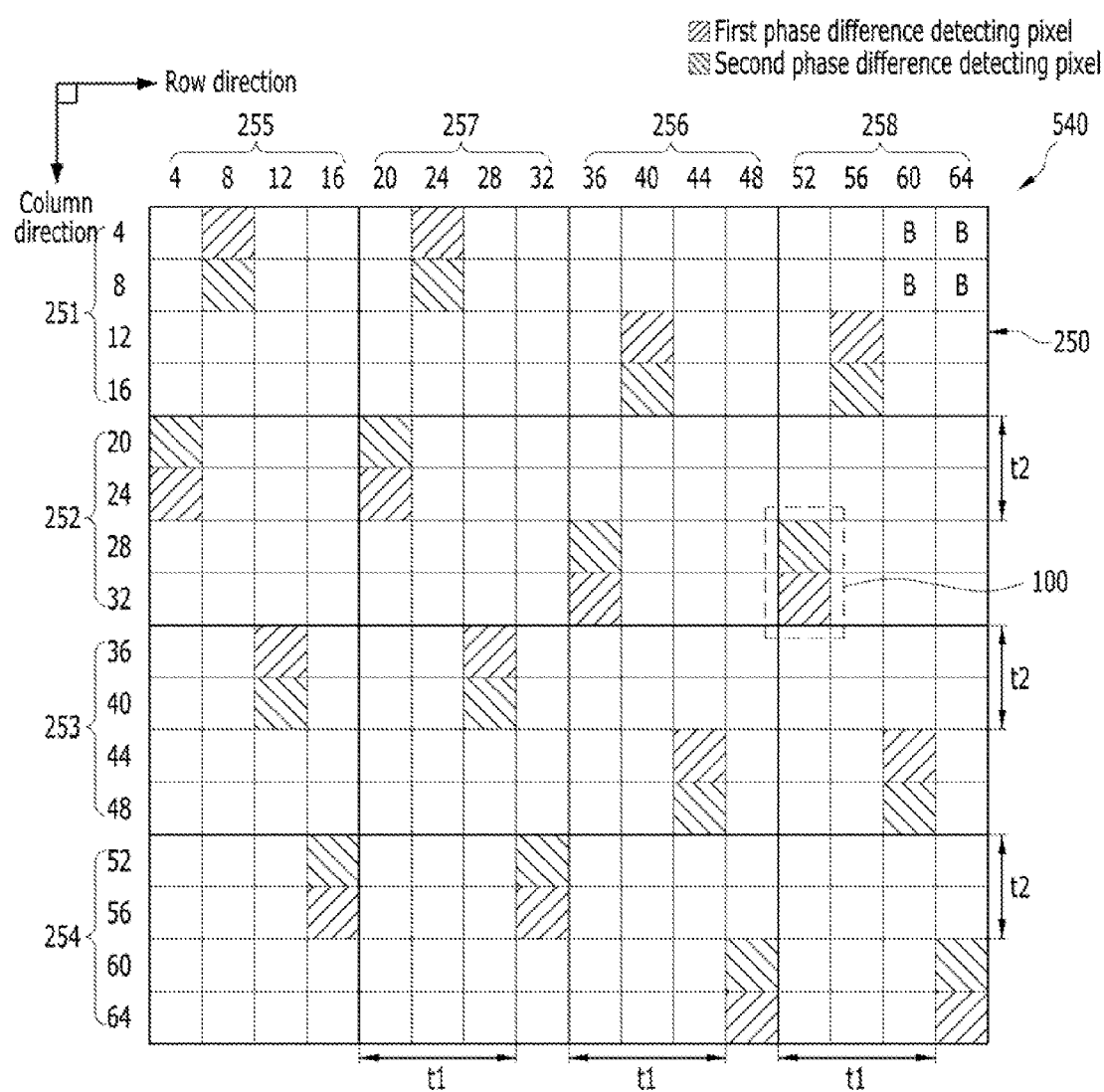
FIGS. 16 and 17 are diagrams illustrating an arrangement of a phase difference detecting unit in accordance with a fourth embodiment of the present invention.
Figure 17:
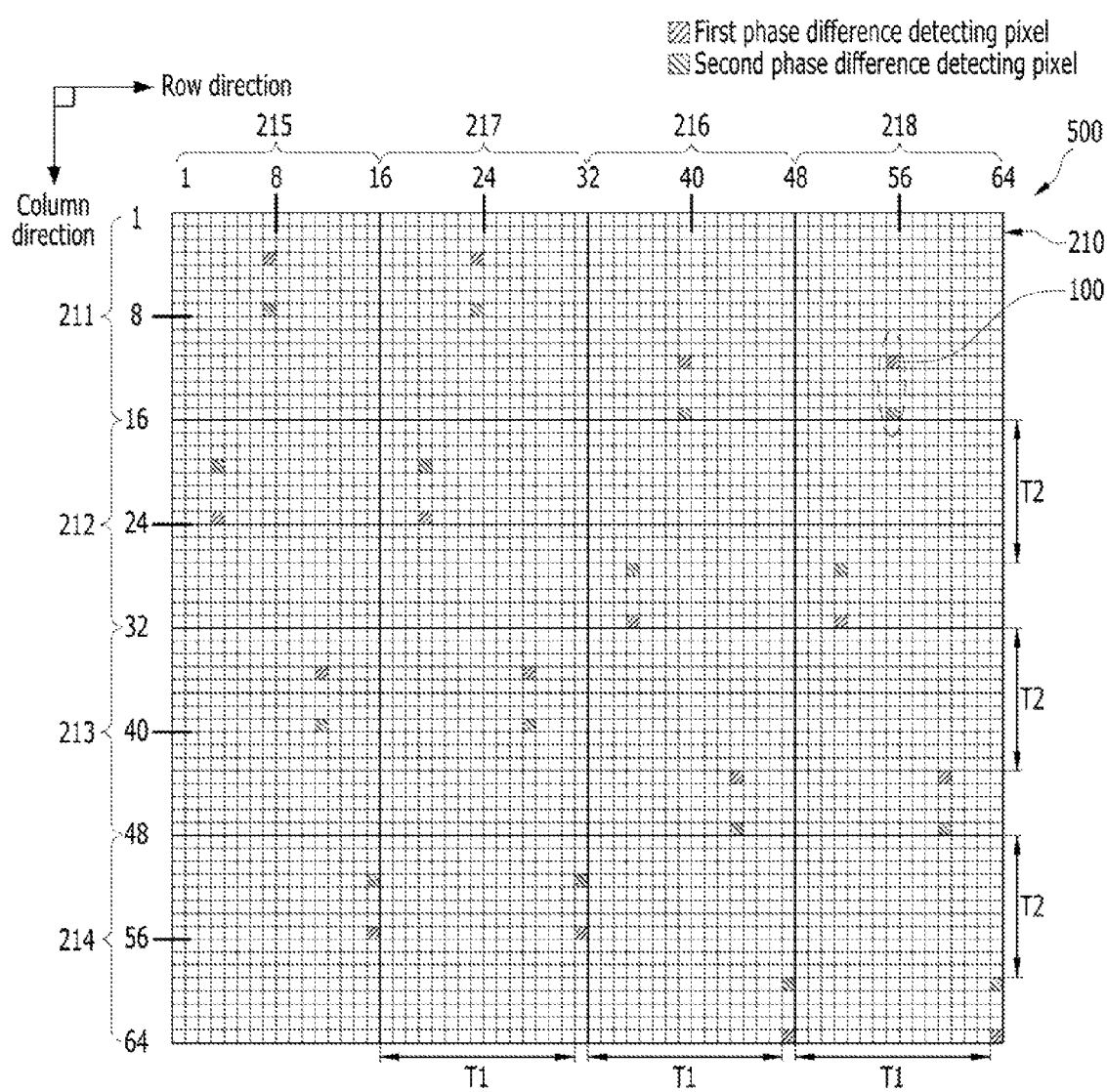

FIGS. 16 and 17 are diagrams illustrating an arrangement of a phase difference detecting unit in accordance with a fourth embodiment of the present invention. FIG. 16 is a plan view illustrating an arrangement of a phase difference detecting unit in a single channel pixel array, and FIG. 17 is a plan view illustrating an arrangement of a phase difference detecting unit in a unit pixel array.

As shown in FIGS. 16 and 17, a unit pixel array 500 of the image sensor in accordance with the fourth embodiment may correspond to the unit pixel arrays 200 of the image sensor in accordance with the first embodiment except the positions of the phase difference detecting units 100. In the first embodiment, the phase difference detecting units 100 is positioned in the second column line 216 in the row direction. In contrast, in the fourth embodiment, the phase difference detecting unit 100 is positioned in the third column line 217 in the row direction.

Therefore, a single channel pixel array 540 of the image sensor in accordance with the fourth embodiment may correspond to the single channel pixel array 240 of the image sensor in accordance with the first embodiment except for positions of phase difference detecting units 100. In the first embodiment, the phase difference detecting unit 100 is positioned in the second column line 256 in the row direction. In contrast, in the fourth embodiment, the phase difference detecting unit 100 is positioned in the third column line 257 in the row direction.

Since the image sensor in accordance with the fourth embodiment has the same arrangement characteristics as the image sensor in accordance with the first embodiment, it is possible to improve performance of the image sensor.

Figure 18:
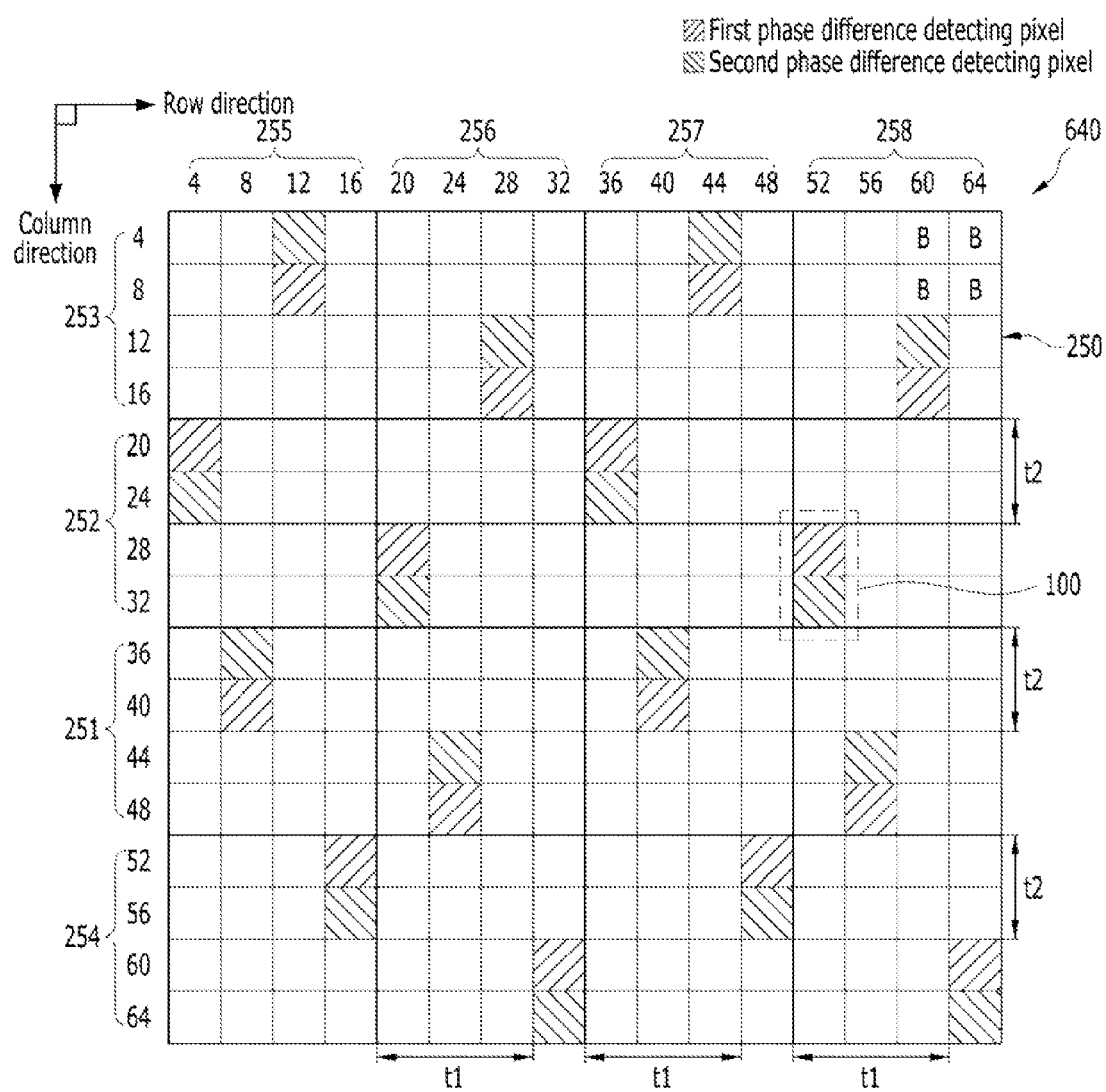
FIGS. 18 and 19 are diagrams illustrating an arrangement of a phase difference detecting unit in accordance with a fifth embodiment of the present invention.
Figure 19:
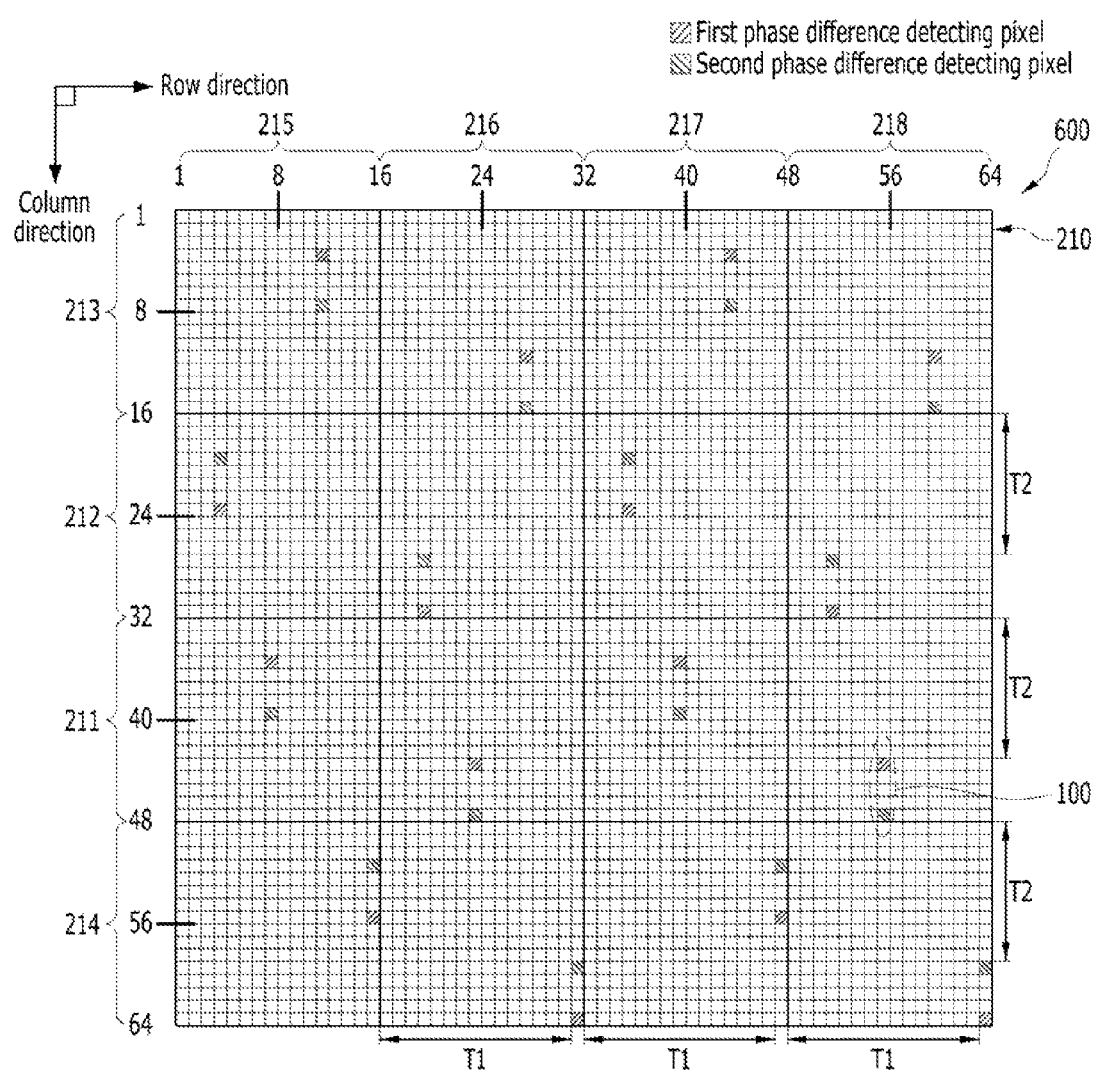

FIGS. 18 and 19 are diagrams illustrating an arrangement of a phase difference detecting unit in accordance with a fifth embodiment of the present invention. FIG. 18 is a plan view illustrating a phase difference detecting unit in a single channel pixel array, and FIG. 19 is a plan view illustrating an arrangement of a phase difference detecting unit in a unit pixel array.

As shown in FIGS. 18 and 19, a unit pixel array 600 of the image sensor in accordance with the fifth embodiment may correspond to the unit pixel arrays 200 of the image sensor in accordance with the first embodiment except for the positions of the phase difference detecting units 100. In the first embodiment, the phase difference detecting unit 100 is positioned in the first row line 211 in the column direction. In contrast, in the fifth embodiment, the phase difference detecting unit 100 is positioned in the third row line 213 in the column direction.

Therefore, a single channel pixel array 640 in accordance with the fifth embodiment may correspond to the single channel pixel array 240 of the image sensor in accordance with the first embodiment except for the positions of phase difference detecting units 100. In the first embodiment, the phase difference detecting unit 100 is positioned in the first row line 251 in the column direction. In contrast, in the fifth embodiment, the phase difference detecting unit 100 is positioned in the third row line 253 in the column direction.

Since the image sensor in accordance with the fifth embodiment has the same arrangement characteristics as the image sensor in accordance with the first embodiment, it is possible to improve performance of the image sensor.

Figure 20:
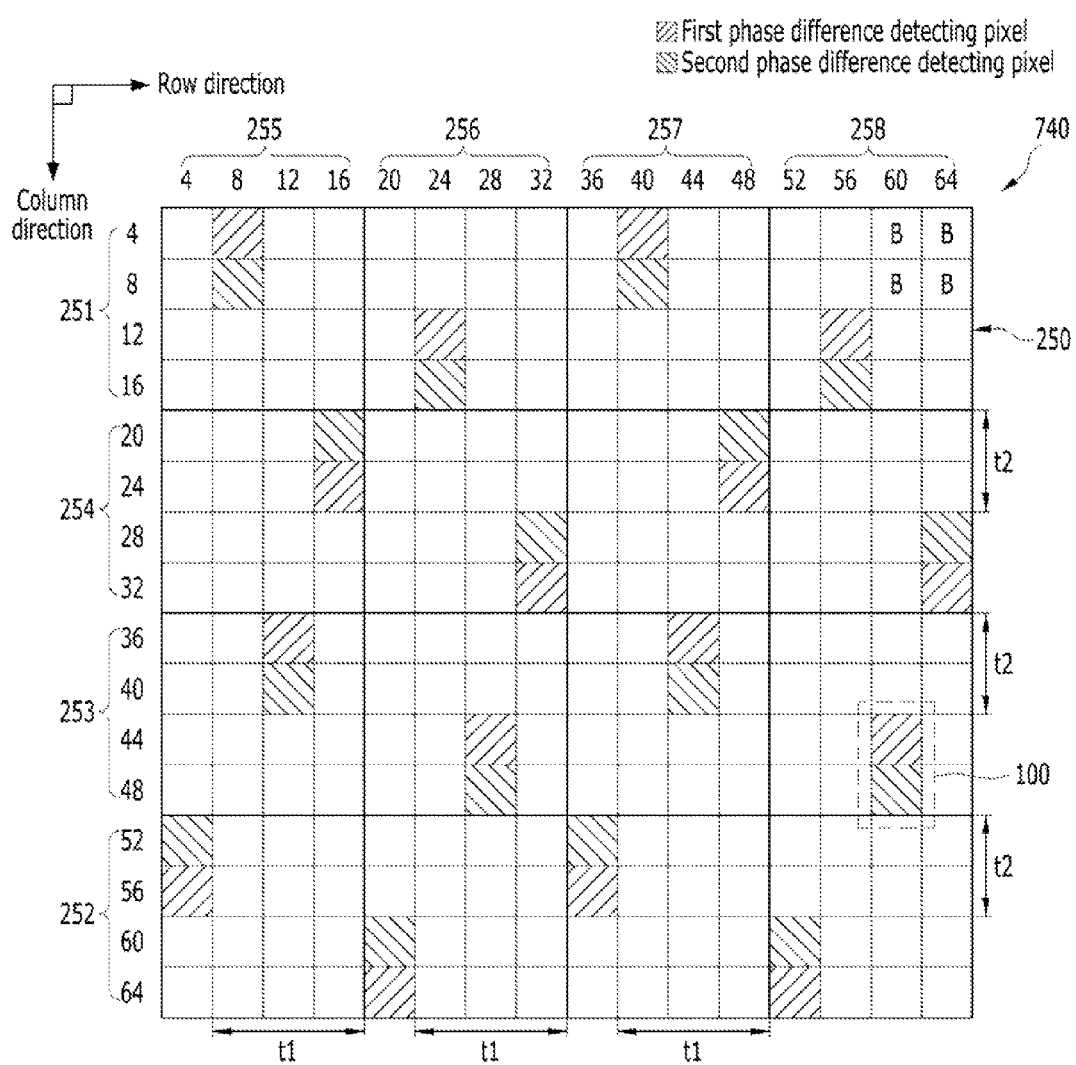
FIGS. 20 and 21 are diagrams illustrating an arrangement of a phase difference detecting unit in accordance with a sixth embodiment of the present invention.
Figure 21:
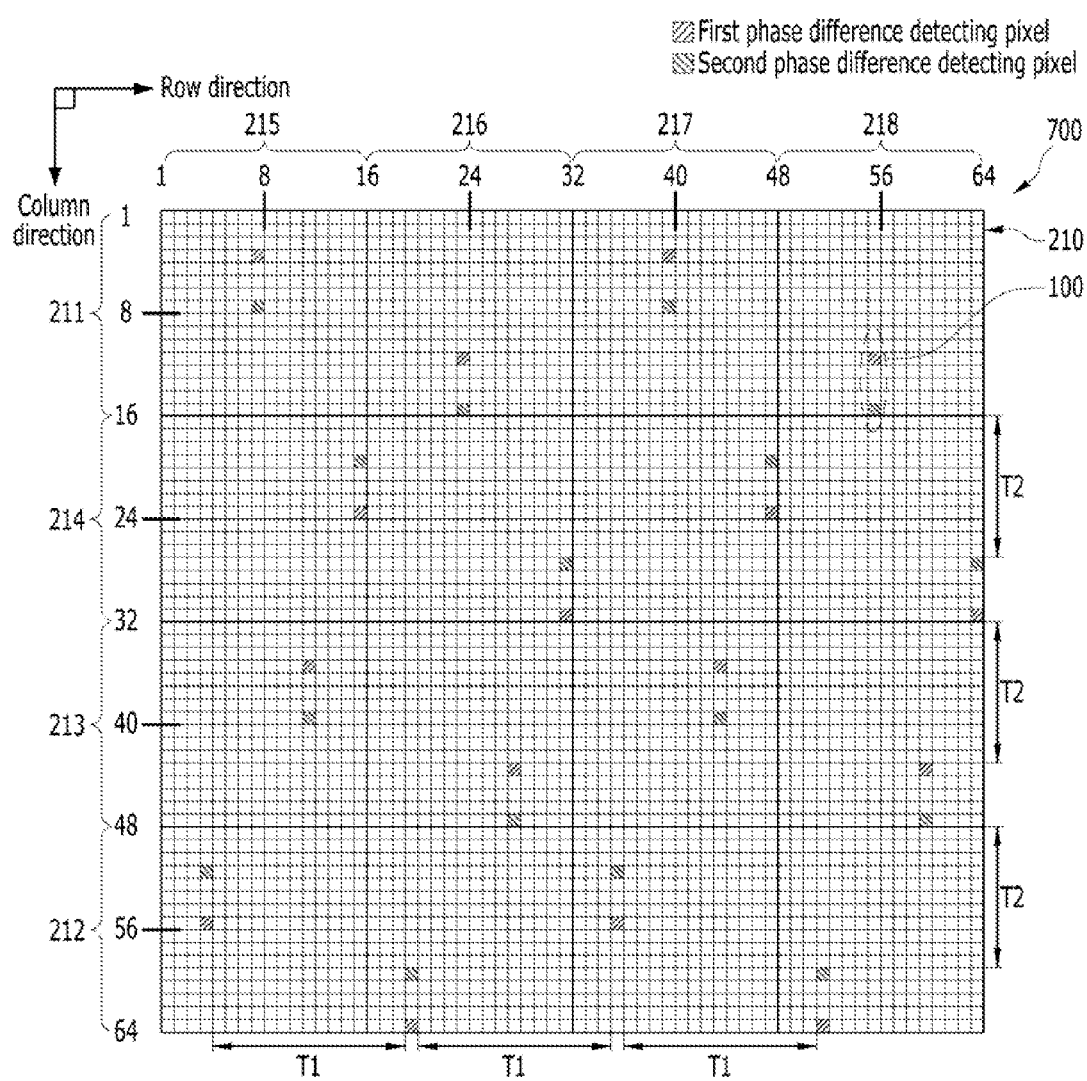

FIGS. 20 and 21 are diagrams illustrating an arrangement of a phase difference detecting unit in accordance with a sixth embodiment of the present invention. FIG. 20 is a plan view illustrating an arrangement of a phase difference detecting unit of a single channel pixel array, and FIG. 21 is a plan view illustrating an arrangement of a phase difference detecting unit in a unit pixel array.

As shown in FIGS. 20 and 21, a unit pixel array 700 of the image sensor in accordance with the sixth embodiment may correspond to the unit pixel arrays 200 of the image sensor in accordance with the first embodiment except for the positions of the phase difference detecting units 100. In the first embodiment, the phase difference detecting unit 100 is positioned in the second row line 212 in the column direction. In contrast, in the sixth embodiment, the phase difference detecting unit 100 is positioned in the fourth row line 214 in the column direction.

Therefore, a single channel pixel array 740 of the image sensor in accordance with the sixth embodiment may correspond to the single channel pixel array 240 of the image sensor in accordance with the first embodiment except for the positions of phase difference detecting units 100. In the first embodiment, the phase difference detecting unit 100 is positioned in the second row line 252 in the column direction. In the sixth embodiment, the phase difference detecting unit 100 is positioned in the fourth row line 254 in the column direction.

Since the image sensor in accordance with the sixth embodiment has the same arrangement characteristics as the image sensor in accordance with the first embodiment, it is possible to improve performance of the image sensor.

The image sensor according to an embodiment may be employed in various electronic devices or systems. Hereinafter, a camera employing the curved image sensor will be described in reference to FIG. 22.

Figure 22:
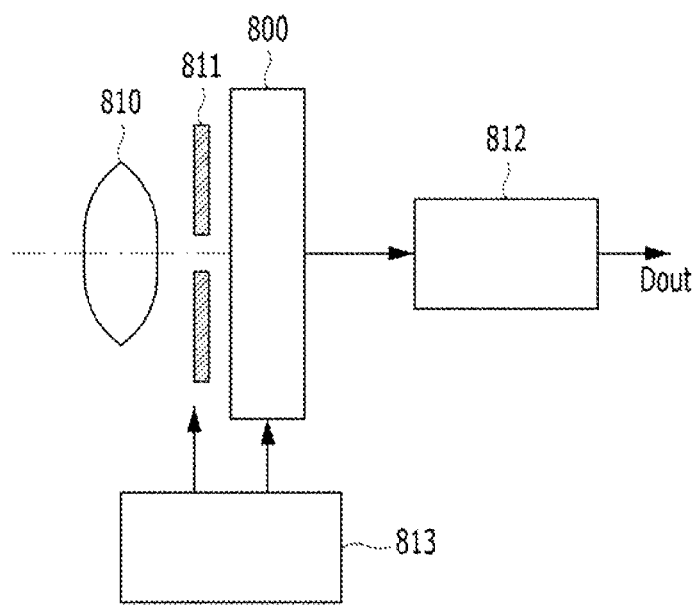
FIG. 22 is a diagram schematically illustrating an electronic device including an image sensor in accordance with an embodiment of the present invention.

FIG. 22 shows an electronic device including an image sensor according to an embodiment of the present invention.

Referring to FIG. 22, an electronic device with an image sensor according to an embodiment may be a camera. The camera may take a still picture or a moving picture. The electronic device may include an optical system (or an optical lens) 810, a shutter unit 811, an image sensor 800, a driving unit 813 for controlling and driving the image sensor 800 and the shutter unit 811, and a signal processing unit 812.

The optical system 810 guides an image of an object (incident light) to the pixel array of the image sensor 800. The optical system 810 may include a plurality of optical lenses. The shutter unit 811 controls emitting and blocking of incident light. The driving unit 813 controls transmission operations of the image sensor 800 and shutter operations of the shutter unit 811. The signal processing unit 812 processes image signals outputted from the image sensor 800. The processed image signal may either be stored in a memory or outputted to a monitor.

According to the present technology, it is possible to rapidly and uniformly detect a phase difference in a full frame and improve interpolation characteristics with respect to phase difference detecting pixels by providing optimized arrangements of phase difference detecting pixels in a pixel array.

Although various embodiments have been described for illustrative purposes, it will be apparent to those skilled in the art that various changes and modifications may be made without departing from the spirit and scope of the invention as defined in the following claims.

What is claimed is:

1. An image sensor comprising:
  a pixel array comprising a plurality of unit pixel arrays,
  wherein each of the plurality of unit pixel arrays comprises a plurality of unit pixel blocks arranged in a 4×4 matrix,
  wherein each of the plurality of unit pixel blocks comprises a phase difference detecting unit so that each of the plurality of unit pixel arrays comprises phase difference detecting units,
  wherein the phase difference detecting unit comprises a first phase difference detecting pixel and a second phase difference detecting pixel,
  wherein the first and the second phase difference detecting pixels have first and second openings, respectively,
  wherein the first and the second openings are arranged in an eccentrically manner with respect to each other, and
  wherein the phase difference detecting units arranged at each of the plurality of unit pixel blocks are asymmetrical to each other on the basis of a boundary line between adjacent unit pixel blocks, and the phase difference detecting unit of each of the plurality of unit pixel blocks is located at different position from the phase difference detecting unit of adjacent unit pixel blocks, wherein the first phase difference detecting pixel and the second phase difference detecting pixel are located at different rows and at the same column, and wherein the plurality of unit pixel blocks are arranged in a matrix having row lines and column lines, and in each of the unit pixel arrays, arrangements of the phase difference detecting units arranged in the plurality of unit pixel blocks at the same row line are the same as each other, arrangements of the phase difference detecting units arranged in the plurality of unit pixel blocks at odd-numbered row lines are the same as each other, arrangements of the phase difference detecting units arranged in the plurality of unit pixel blocks at even-numbered row lines are the same as each other, and the arrangements of the phase difference detecting units arranged in the plurality of unit pixel blocks at the even-numbered row lines are opposite to the arrangements of the phase difference detecting units arranged in the plurality of unit pixel blocks at the odd-numbered row lines.

2. The image sensor of claim 1, wherein each of the plurality of unit pixel blocks face each other on the basis of the boundary line between adjacent unit pixel blocks, and
   wherein the phase difference detecting units arranged in the unit pixel blocks facing each other are arranged so as not to overlap with each other.

3. The image sensor of claim 1, wherein the first phase difference detecting pixel and the second phase difference detecting pixel are located at different rows and at the same column.

4. The image sensor of claim 1, wherein a spacing between adjacent phase difference detecting units included in the given unit pixel array is constant in a row direction and in a column direction, respectively, and
   wherein the adjacent phase difference detecting units have a first spacing in the row direction and a second spacing smaller than the first spacing in the column direction.

5. The image sensor of claim 1, wherein the first phase difference detecting pixel and the second phase difference detecting pixel have first and second openings, respectively, and
   wherein the first and the second openings are eccentrically disposed on one side and on another side in a row direction.

6. The image sensor of claim 1, wherein the first phase difference detecting pixel and the second phase difference detecting pixel have first and second openings, respectively, and
   wherein the first and the second openings are eccentrically disposed on one side and side in a column direction.

7. The image sensor of claim 1, wherein the pixel array comprises an RGr/GbB Bayer pattern in which red pixels, green pixels and blue pixels are repeatedly arranged, or a WRGB pattern in which white pixels, red pixels, green pixels and blue pixels are repeatedly arranged.

8. The image sensor of claim 7, wherein both of the first phase difference detecting pixel and the second phase difference detecting pixel replace blue pixels.

9. An image sensor comprising:
   a pixel array comprising a plurality of unit pixel arrays,
   wherein each of the plurality of unit pixel arrays comprises a plurality of unit pixel blocks arranged in a 4×4 matrix,
   wherein each of the plurality of unit pixel blocks comprises a phase difference detecting unit so that each of the plurality of unit pixel arrays comprises phase difference detecting units,
   wherein the phase difference detecting unit comprises a first phase difference detecting pixel and a second phase difference detecting pixel,
   wherein the first and the second phase difference detecting pixels have first and second openings, respectively,
   wherein the first and the second openings are arranged in an eccentrically manner with respect to each other, and
   wherein the phase difference detecting units arranged at each of the plurality of unit pixel blocks are asymmetrical to each other on the basis of a boundary line between adjacent unit pixel blocks, and the phase difference detecting unit of each of the plurality of unit pixel blocks is located at different position from the phase difference detecting unit of adjacent unit pixel blocks,
   wherein the phase difference detecting units included in a given unit pixel array are located at different rows from each other, and
   wherein the plurality of unit pixel blocks are arranged in a matrix having row lines and column lines, and in each of the unit pixel arrays,
   arrangements of the phase difference detecting units arranged in the plurality of unit pixel blocks at the same column line are the same as each other,
   arrangements of the phase difference detecting units arranged in the plurality of unit pixel blocks at odd-numbered column lines are the same as each other,
   arrangements of the phase difference detecting units arranged in the plurality of unit pixel blocks at even-numbered column lines are the same as each other, and
   the arrangements of the phase difference detecting units arranged in the plurality of unit pixel blocks at the even-numbered column lines are opposite to the arrangements of the phase difference detecting units arranged in the plurality of unit pixel blocks at the odd-numbered column lines.

10. The image sensor of claim 9, wherein the first phase difference detecting pixel and the second phase difference detecting pixel are located at different columns and at the same row.

11. The image sensor of claim 9, wherein a spacing between adjacent phase difference detecting units included in each of the unit pixel arrays is constant in a row direction and in a column direction, and
    wherein the adjacent phase difference detecting units have a first spacing in the row direction and a second spacing larger than the first spacing in the column direction.

12. An image sensor comprising:
    a pixel array in which a plurality of unit pixel groups each having a 2×2 matrix are two-dimensionally arranged,
    wherein the pixel array comprises
    a plurality of single channel pixel arrays in which a plurality of single channel pixel blocks is arranged in a 4×4 matrix, respectively, and
    wherein the plurality of single channel pixel blocks are formed by pixels extracted in the same position from each of the plurality of unit pixel groups and include a phase difference detecting unit, respectively; and
    wherein the phase difference detecting unit comprises a first phase difference detecting pixel and a second phase difference detecting pixel which have openings eccentrically disposed in different directions;

wherein in each of the plurality of single channel pixel arrays, the phase difference detecting units arranged in the plurality of single channel pixel blocks are asymmetrical to each other in a row direction or a column direction, and the phase difference detecting unit is located at different position from phase difference detecting units of adjacent unit pixel blocks, wherein when in each of the plurality of single channel pixel arrays, the phase difference detecting units arranged in the plurality of single channel pixel blocks do not overlap with each other in a column direction, and wherein the first phase difference detecting pixel and the second phase difference detecting pixel are located at different rows and at the same column, and wherein the plurality of single channel pixel blocks are arranged in a matrix having row lines and column lines, and in each of the single channel pixel arrays, arrangements of the phase difference detecting units arranged in the plurality of single channel pixel blocks at the same row line are the same as each other, arrangements of the phase difference detecting units arranged in the plurality of single channel pixel blocks at odd-numbered row lines are the same as each other, arrangements of the phase difference detecting units arranged in the plurality of single channel pixel blocks at even-numbered row lines are the same as each other, and the arrangements of the phase difference detecting units arranged in the plurality of single channel pixel blocks at the even-numbered row lines are opposite to the arrangements of the phase difference detecting units arranged in the plurality of single channel pixel blocks at the odd-numbered row lines.

13. The image sensor of claim 12, wherein a spacing between adjacent phase difference detecting units in each of the plurality of single channel pixel arrays is constant in a row direction and in a column direction, and wherein the adjacent phase difference detecting units have a first spacing in the row direction and a second spacing smaller than the first spacing in the column direction.

14. The image sensor of claim 12, wherein the pixel array comprises:

a plurality of unit pixel arrays, wherein, in each of the plurality of unit pixel arrays, a plurality of unit pixel blocks is arranged in a 4×4 matrix, and wherein each of the plurality of single channel pixel blocks corresponds to each of the plurality of unit pixel blocks.

15. The image sensor of claim 12, wherein the pixel array comprises a plurality of unit pixel arrays, wherein, in each of the plurality of unit pixel arrays, a plurality of unit pixel blocks is arranged in a 4×4 matrix, wherein each of the plurality of unit pixel arrays comprises a plurality of sub-sampling pixel arrays, wherein, in each of the plurality of sub-sampling pixel arrays, the sub-sampling pixel blocks are arranged in a 4×4 matrix, and wherein each of the plurality of single channel pixel blocks corresponds to each of the plurality of sub-sampling pixel blocks.

16. The image sensor of claim 12, wherein the first phase difference detecting pixel and the second phase difference detecting pixel have first and second openings, respectively, and wherein the first and the second openings are eccentrically disposed on one side and on another side in a row direction.

17. The image sensor of claim 12, wherein the first phase difference detecting pixel and the second phase difference detecting pixel have first and second openings, respectively, and wherein the first and the second openings are eccentrically disposed on one side and on another side in a column direction.

18. The image sensor of claim 12, wherein each of the plurality of unit pixel groups has an RGr/GbB Bayer pattern in which red pixels, green pixels and blue pixels are repeatedly arranged, or a WRGB pattern in which white pixels, red pixels, green pixels and blue pixels are repeatedly arranged.

19. The image sensor of claim 18, wherein each of the plurality of single channel pixel blocks include a plurality of the blue pixels, and wherein the first phase difference detecting pixel and the second phase difference detecting pixel replace the blue pixels.

20. An image sensor comprising:

a pixel array in which a plurality of unit pixel groups each having a 2×2 matrix are two-dimensionally arranged, wherein the pixel array comprises a plurality of single channel pixel arrays in which a plurality of single channel pixel blocks is arranged in a 4×4 matrix, respectively, and wherein the plurality of single channel pixel blocks are formed by pixels extracted in the same position from each of the plurality of unit pixel groups and include a phase difference detecting unit, respectively; and wherein the phase difference detecting unit comprises a first phase difference detecting pixel and a second phase difference detecting pixel which have openings eccentrically disposed in different directions;

wherein in each of the plurality of single channel pixel arrays, the phase difference detecting units arranged in the plurality of single channel pixel blocks are asymmetrical to each other in a row direction or a column direction, and the phase difference detecting unit is located at different position from phase difference detecting units of adjacent unit pixel blocks, wherein when in each of the plurality of single channel pixel arrays, the phase difference detecting units arranged in the plurality of single channel pixel blocks do not overlap with each other in a row direction, and wherein the first phase difference detecting pixel and the second phase difference detecting pixel are located at different columns and at the same row, wherein the plurality of single channel pixel blocks are arranged in a matrix having row lines and column lines, and in each of the single channel pixel arrays, arrangements of the phase difference detecting units arranged in the plurality of single channel pixel blocks at the same column line are the same as each other, arrangements of the phase difference detecting units arranged in the plurality of single channel pixel blocks at odd-numbered column lines are the same as each other, arrangements of the phase difference detecting units arranged in the plurality of single channel pixel blocks at even-numbered column lines are the same as each other, and the arrangements of the phase difference detecting units arranged in the plurality of single channel pixel blocks at the even-numbered column lines are opposite to the arrangements of the phase difference detecting units arranged in the plurality of single channel pixel blocks at the odd-numbered column lines.

21. The image sensor of claim 20, wherein a spacing between adjacent phase difference detecting units in each of the plurality of single channel pixel arrays is constant in a row direction and in a column direction, and wherein the adjacent phase difference detecting units have a first spacing in the row direction and a second spacing larger than the first spacing in the column direction.

* * * * *